(12) United States Patent
Yan et al.

(10) Patent No.: US 8,476,652 B2
(45) Date of Patent: Jul. 2, 2013

(54) THREE-DIMENSIONAL LIGHT-EMITTING DEVICES AND METHOD FOR FABRICATING THE SAME

(75) Inventors: Chunhui Yan, El Monte, CA (US); Jianping Zhang, El Monte, CA (US); Ying Liu, El Monte, CA (US); Fanghai Zhao, El Monte, CA (US); Kevin Ma, El Monte, CA (US)

(73) Assignee: InvenLux Corporation, El Monte, CA (US)

( * ) Notice: Subject to any disclaimer, the term of this patent is extended or adjusted under 35 U.S.C. 154(b) by 334 days.

(21) Appl. No.: 12/848,053

(22) Filed: Jul. 30, 2010

(65) Prior Publication Data

US 2012/0025230 A1    Feb. 2, 2012

(51) Int. Cl.
*H01L 33/00* (2010.01)

(52) U.S. Cl.
USPC .................. 257/89; 257/88; 257/E33.047

(58) Field of Classification Search
USPC .............. 257/79, 88, 89, 90, 96, 97, E33.001, 257/E33.047, E33.048
See application file for complete search history.

(56) References Cited

U.S. PATENT DOCUMENTS

| | | | | |
|---|---|---|---|---|
| 5,619,521 | A | 4/1997 | Tanaka | 372/50 |
| 5,955,749 | A | 9/1999 | Joannopoulos et al. | 257/98 |
| 7,166,870 | B2 | 1/2007 | Erchak et al. | 257/86 |
| 7,173,289 | B1 | 2/2007 | Wu et al. | 257/98 |
| 7,217,947 | B2 * | 5/2007 | Clarke et al. | 257/14 |
| 7,250,635 | B2 | 7/2007 | Lee et al. | 257/98 |
| 7,355,210 | B2 | 4/2008 | Ou et al. | 257/95 |
| 7,422,962 | B2 | 9/2008 | Chen et al. | 438/456 |
| 7,615,398 | B2 | 11/2009 | McKenzie et al. | 438/65 |
| 7,642,108 | B2 | 1/2010 | Krames et al. | 438/22 |
| 7,652,295 | B2 | 1/2010 | Cho et al. | 257/79 |
| 7,683,386 | B2 | 3/2010 | Tanaka et al. | 257/88 |
| 7,847,304 | B2 * | 12/2010 | Taninaka et al. | 257/90 |
| 7,880,182 | B2 * | 2/2011 | Yao et al. | 257/88 |
| 8,030,669 | B2 * | 10/2011 | Shakuda et al. | 257/88 |
| 2003/0001161 | A1 | 1/2003 | Ota et al. | 257/79 |
| 2004/0262617 | A1 * | 12/2004 | Hahm et al. | 257/79 |

(Continued)

OTHER PUBLICATIONS

U.S. Appl. No. 12/761,708, filed Apr. 16, 2010, Chunhui Yan et al.

(Continued)

*Primary Examiner* — Eduardo A Rodela
(74) *Attorney, Agent, or Firm* — J.C. Patents

(57) ABSTRACT

A three-dimensional LED structure with vertically displaced active-region includes at least two groups of vertically displaced surfaces on a non-planar substrate. The first group of surfaces are separated from the second group of surfaces by a vertical distance in the growth direction of the LED structure. The first group of surfaces are connected to the second group of surfaces by sidewalls, respectively. The sidewalls can be inclined or vertical and have a sufficient height so that a layer such as an n-type layer, an active-region, or a p-type layer in a first LED structure deposited on the first group of surfaces and a corresponding layer such as an n-type layer, an active-region, or a p-type layer in a second LED structure deposited on the second group of surfaces are separated by the sidewalls. The two groups of surfaces may be vertically displaced from each other in certain areas of an LED chip, while merge into an integral surface in other areas. A method for fabricating the three-dimensional LED structure is also provided.

26 Claims, 20 Drawing Sheets

U.S. PATENT DOCUMENTS

| | | | |
|---|---|---|---|
| 2006/0060833 A1 | 3/2006 | Bruckner et al. | 257/13 |
| 2006/0255349 A1* | 11/2006 | Liu | 257/94 |
| 2007/0200135 A1 | 8/2007 | Wang | 257/103 |
| 2008/0029757 A1 | 2/2008 | West et al. | 257/14 |
| 2009/0032799 A1 | 2/2009 | Pan | 257/13 |
| 2010/0096652 A1 | 4/2010 | Choi et al. | 257/98 |

OTHER PUBLICATIONS

U.S. Appl. No. 12/824,097, filed Jun. 25, 2010, Chunhui Yan et al.

* cited by examiner

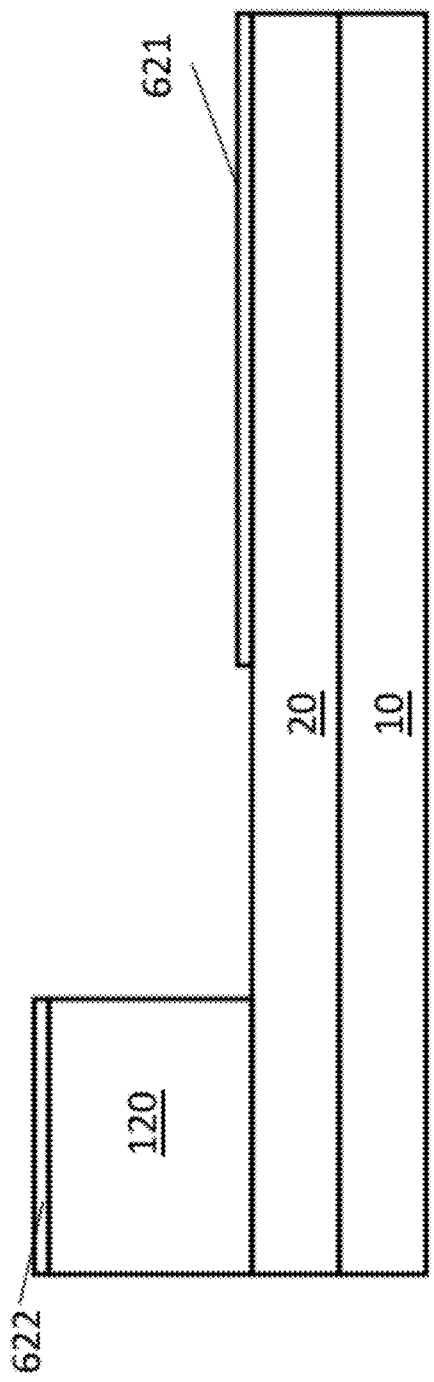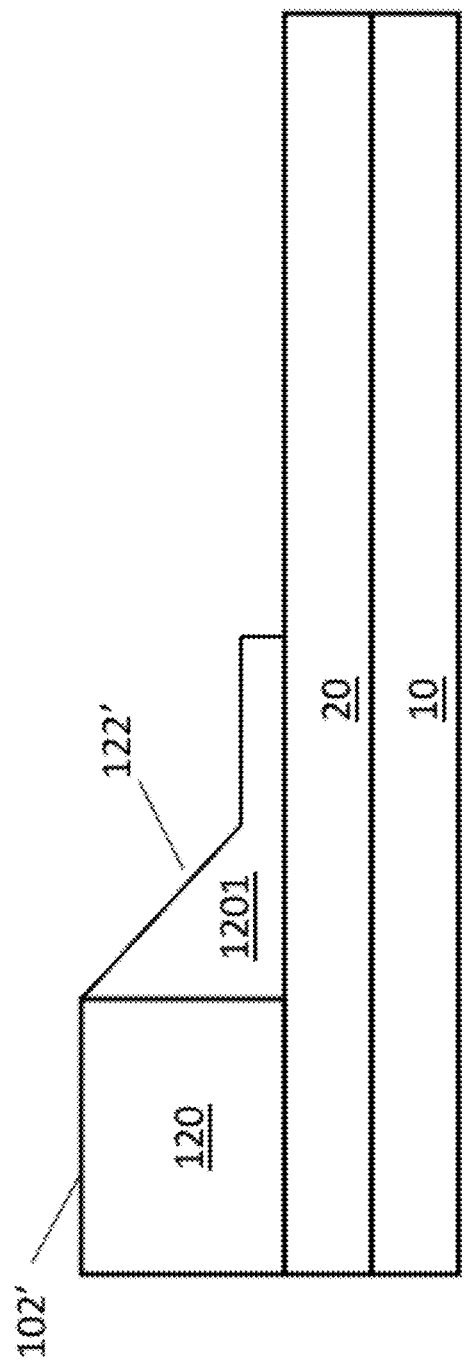

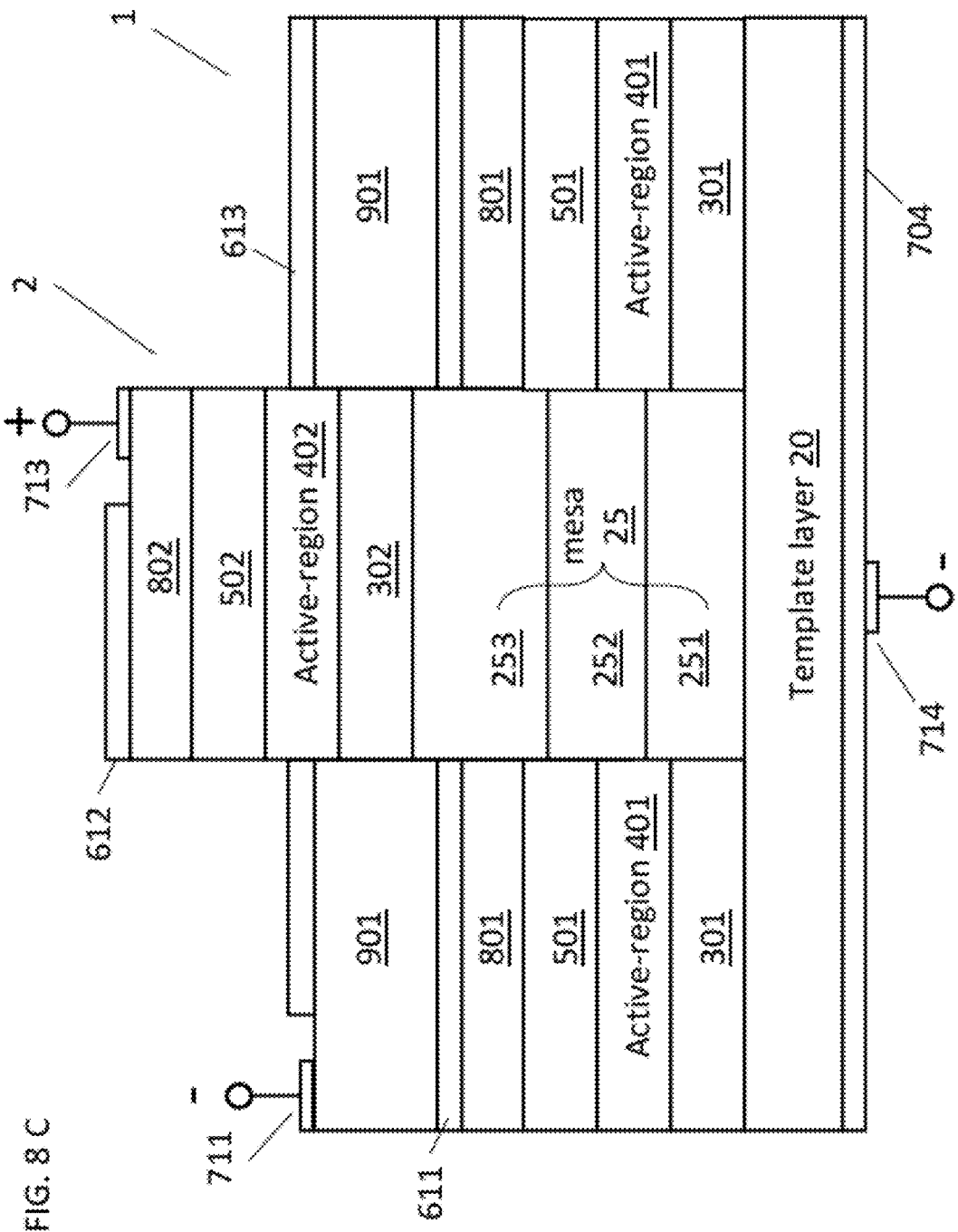

THREE-DIMENSIONAL LIGHT-EMITTING DEVICES AND METHOD FOR FABRICATING THE SAME

1. FIELD OF THE INVENTION

The present invention relates in general to light-emitting devices, and more particularly to light-emitting devices with vertically displaced active-region and reduced self-absorption and enhanced light extraction. The present invention also relates to method for fabricating light-emitting devices with vertically displaced active-region.

2. DESCRIPTION OF THE RELATED ART

Light-emitting devices in the prior art are composed by laminate structures, that is, an individual layer in a light-emitting structure such as a light-emitting diode (LED) chip usually is a continuous layer and lies in the same plane, and the structure is accomplished layer-by-layer by stacking layers of different composition and conductivity type. A conventional light-emitting device such as an LED usually includes a flat substrate, a continuous n-type layer formed on the substrate, a continuous active-region formed on the n-type layer, and a continuous p-type layer formed on the active-region. A cathode and an anode are connected to the n-type layer and the p-type layer, respectively. These LEDs for simplicity in description can be labeled as two-dimensional (2D) LEDs. Certain limitations related to 2D LEDs are proposed by the inventors of this application. First, as explained in U.S. patent application Ser. No. 12/761,708 filed on Apr. 16, 2010 by the same inventors, the content of which is hereby incorporated by reference in its entirety, the conventional 2D LED structure can exert lateral waveguide effect and result in strong light self-absorption within the n-type layer, the active-region and the p-type layer, especially within the active-region. Second, the continuous laminate structure does not favor for strain-relaxation in the n-type layer, the active-region and the p-type layer. And thirdly, for piezoelectric materials, such as III-V nitrides and II-VI oxides, the accumulated strain in the continuous laminate structure means poor light-generation efficiency in the active-region.

There are some modifications to alleviate the abovementioned limitations related to 2D LEDs in literature. Methods like surface roughening (modifying continuity of the ending surface, e.g. U.S. Pat. Nos. 7,422,962, 7,355,210), substrate patterning (modifying continuity of the starting surface, e.g. U.S. Pat. No. 7,683,386), and photonic crystal incorporation (modifying continuity of layers close to active-region, e.g. U.S. Pat. Nos. 5,955,749, 7,166,870, 7,615,398, 7,173,289, 7,642,108, 7,652,295, 7,250,635) were introduced in the prior art. In the inventors' previous U.S. patent application Ser. No. 12/824,097 filed on Jun. 25, 2010, the content of which is hereby incorporated by reference in its entirety, the active-region is displaced to interrupt the conventional laminate structure. Optionally, active-region grown on non-planar surfaces is also proposed in US patent application publication No. 2006/0060833.

3. SUMMARY OF THE INVENTION

The present invention discloses three-dimensional (3D) LED structures with vertically displaced active-region to overcome or relieve the problems associated with the prior art 2D LED structures.

According to one aspect of the present invention, a 3D LED epitaxial structure starts on a non-planar substrate or template layer which includes at least two groups of vertically displaced surfaces. The second group of surfaces are separated from the first group of surfaces by a vertical distance in the growth direction of the LED structure. The first group of surfaces are connected to the second group of surfaces by sidewalls, respectively. The sidewalls can be inclined or vertical or any other proper shape and have a sufficient height so that a layer such as an n-type layer, an active-region, or a p-type layer in a first LED structure deposited on the first group of surfaces and a corresponding layer such as an n-type layer, an active-region, or a p-type layer in a second LED structure deposited on the second group of surfaces are separated by the sidewalls. In other words, a layer such as an n-type layer, an active-region, and a p-type layer does not continuously grow over the sidewalls from the first group of surfaces to the second group surfaces. The two groups of surfaces may or may not share overlapping portions. In other words, the two groups of surfaces may be vertically displaced from each other in certain areas of an LED chip, while merge into a single or an integral surface in other areas. Upon epitaxial growth, a first LED structure is deposited on the first surfaces and a second LED structure on the second surfaces. The LED structure at least comprises an n-type layer, an active-region, and a p-type layer. The vertical distance can be chosen so that the p-type layer of the first LED structure reaches and is in contact with the n-type layer of the second LED structure. The vertical distance can also be chosen so that the p-type layer of the first LED structure does not reach and is not in contact with the n-type layer of the second LED structure, i.e., the first and second LED structures are completely separated from each other.

According to another aspect of the present invention, a light emitting diode (LED) chip is provided which comprises:
a substrate including an integral region, a separating region and a slope region there between;
a mesa formed on the substrate, wherein the upper surface of the mesa is vertically displaced relative to the upper surface of the substrate exposed by the mesa in the separating region, and the upper surface of the substrate exposed by the mesa in the separating region is connected to the upper surface of the mesa in the integral region via a slope surface in the slope region;
a first LED structure formed on the upper surface of the substrate exposed by the mesa in the separating region and a second LED structure formed on the upper surface of the mesa in the separating region, wherein the first LED structure comprises a first n-type layer, a first active-region, and a first p-type layer, the second LED structure comprises a second n-type layer, a second active-region, and a second p-type layer, and the first and second LED structures are separated from each other in the separating region, while in the integral region, the first and second n-type layers merge into a single n-type layer, the first and second active-regions merge into a single active-region, and the first and second p-type layers merge into a single p-type layer.

The mesa can be an integral part of the substrate.

The light emitting diode (LED) chip may further comprise a template layer between the substrate and the mesa, wherein the mesa is formed on the template layer, the upper surface of the mesa is vertically displaced relative to the upper surface of the template layer exposed by the mesa in the separating region, and the upper surface of the template layer exposed by the mesa in the separating region is connected to the upper surface of the mesa in the integral region via a slope surface in the slope region, and the first LED structure is formed on the upper surface of the template layer exposed by the mesa in the separating region.

The mesa can be an integral part of the template layer, or a single insulating layer.

The mesa may comprise an insulating top layer, a mid layer, and a bottom layer, and when the first n-type layer in the first LED structure is grown from the substrate, the mid layer is in contact with the first p-type layer and the first active-region via its sidewall, and the bottom layer is in contact with the first active-region and the first n-type layer via its sidewall, while when the first p-type layer in the first LED structure is grown from the substrate, the mid layer is in contact with the first n-type layer and the first active-region via its sidewall, and the bottom layer is in contact with the first active-region and the first p-type layer via its sidewall.

When the first n-type layer in the first LED structure is grown from the substrate, the mid layer is an insulating layer and the bottom layer is an n-type layer, or the mid layer is a p-type layer and the bottom layer is an insulating layer, while when the first p-type layer in the first LED structure is grown from the substrate, the mid layer is an insulating layer and the bottom layer is a p-type layer, or the mid layer is an n-type layer and the bottom layer is an insulating layer.

The light emitting diode (LED) chip may further comprise a gap in the slope region, which separates the first and second LED structures in the slope region.

According to one aspect of the present invention, a light emitting diode (LED) chip is provided which comprises:
  a base for epitaxial growth thereon, having an integral region, a separating region and a slope region located between, wherein there are at least a group of first surfaces and a group of second surfaces vertically displaced from the first surfaces in the separating region, and the first surfaces and the second surfaces merge into a single surface in the integral region via a slope surface in the slope region;
  a first LED structure formed on the first surfaces in the separating region and a second LED structure formed on the second surfaces in the separating region, wherein the first LED structure comprises a first n-type layer, a first active-region, and a first p-type layer, the second LED structure comprises a second n-type layer, a second active-region, and a second p-type layer, and the first and second LED structures are separated from each other in the separating region, while in the integral region, the first and second n-type layers merge into a single n-type layer, the first and second active-regions merge into a single active-region, and the first and second p-type layers merge into a single p-type layer, via the slope surface in the slope region.

The first surfaces and the second surfaces are connected by sidewalls, preferably vertical sidewalls.

The base can be a single substrate. The base can include a substrate with vertically displaced upper surfaces and a template layer conformably formed on the substrate. The base can include a flat substrate and a template layer with vertically displaced upper surfaces. The base can include a flat substrate and a mesa of predetermined pattern formed on the substrate. The base can include a flat substrate, a flat template layer formed on the substrate and a mesa of predetermined pattern formed on the flat template layer, wherein the upper surfaces of the mesa in the separating region constitute the second surfaces and the upper surfaces of the template layer exposed by the mesa in the separating region constitute the first surfaces.

The mesa can comprise an insulating top layer, a mid layer, and a bottom layer, and when the first n-type layer in the first LED structure is grown from the base, the mid layer is in contact with the first p-type layer and the first active-region via its sidewall, and the bottom layer is in contact with the first active-region and the first n-type layer via its sidewall, while when the first p-type layer in the first LED structure is grown from the base, the mid layer is in contact with the first n-type layer and the first active-region via its sidewall, and the bottom layer is in contact with the first active-region and the first p-type layer via its sidewall.

When the first n-type layer in the first LED structure is grown from the base, the mid layer is an insulating layer and the bottom layer is an n-type layer, or the mid layer is a p-type layer and the bottom layer is an insulating layer, while when the first p-type layer in the first LED structure is grown from the base, the mid layer is an insulating layer and the bottom layer is a p-type layer, or the mid layer is an n-type layer and the bottom layer is an insulating layer.

The light emitting diode (LED) chip may further comprise a gap in the slope region, which separates the first and second LED structures in the slope region.

According to one aspect of the present invention, a light emitting diode (LED) chip is provided which comprises:
  a substrate;
  a mesa formed on the substrate, wherein the upper surface of the mesa is vertically displaced relative to the upper surface of the substrate exposed by the mesa;
  a first LED structure formed on the upper surface of the substrate exposed by the mesa and a second LED structure formed on the upper surface of the mesa, wherein the first LED structure comprises a first n-type layer, a first active-region, and a first p-type layer, the second LED structure comprises a second n-type layer, a second active-region, and a second p-type layer; and
  if the first and second n-type layers are grown from the substrate and the mesa, the first p-type layer is in contact with the second n-type layer via its sidewall, and if the first and second p-type layers are grown from the substrate and the mesa, the first n-type layer is in contact with the second p-type layer via its sidewall.

The mesa can be an integral part of the substrate.

The light emitting diode (LED) chip may further comprise a template layer between the substrate and the mesa, wherein the mesa is formed on the template layer, the upper surface of the mesa is vertically displaced relative to the upper surface of the template layer exposed by the mesa, and the first LED structure is formed on the upper surface of the template layer exposed by the mesa.

The mesa can be an integral part of the template layer.

The mesa can comprise a top layer and a bottom layer, and when the first and second n-type layers are grown from the substrate and mesa, the top layer is in contact with the first p-type layer and the first active-region via its sidewall, and the bottom layer is in contact with the first active-region and the first n-type layer via its sidewall, and the top layer is an insulating layer and the bottom layer is an n-type layer, or the top layer is a p-type layer and the bottom layer is an insulating layer, while when the first and second p-type layers are grown from the substrate and the mesa, the top layer is in contact with the first n-type layer and the first active-region via its sidewall, and the bottom layer is in contact with the first active-region and the first p-type layer via its sidewall, the top layer is an insulating layer and the bottom layer is a p-type layer, or the mid layer is an n-type layer and the bottom layer is an insulating layer.

According to one aspect of the present invention, a light emitting diode (LED) chip is provided which comprises:
a substrate;
a mesa formed on the substrate, wherein the upper surface of the mesa is vertically displaced relative to the upper surface of the substrate exposed by the mesa;
a first LED structure formed on the upper surface of the substrate exposed by the mesa and a second LED structure formed on the upper surface of the mesa, wherein the first and second LED structures are completely separated by the mesa.

The mesa can be an integral part of the substrate.

The light emitting diode (LED) chip may further comprises a template layer between the substrate and the mesa, wherein the mesa is formed on the template layer, the upper surface of the mesa is vertically displaced relative to the upper surface of the template layer exposed by the mesa, and the first LED structure is formed on the upper surface of the template layer exposed by the mesa.

The mesa can be an integral part of the template layer.

The mesa can comprise a top insulating layer and a bottom layer, and when the first and second n-type layers are grown from the substrate and mesa, the top layer is in contact with the first p-type layer and the first active-region via its sidewall, and the bottom layer is in contact with the first active-region and the first n-type layer via its sidewall, and the bottom layer is an n-type layer or an insulating layer, while when the first and second p-type layers are grown from the substrate and the mesa, the top layer is in contact with the first n-type layer and the first active-region via its sidewall, and the bottom layer is in contact with the first active-region and the first p-type layer via its sidewall, the bottom layer is a p-type layer or an insulating layer.

According to one aspect of the present invention, a method for manufacturing a light emitting device is provided which comprises:
providing a substrate having an integral region, a separating region and a slope region there between;
forming a mesa on the substrate, wherein the upper surface of the mesa is vertically displaced relative to the upper surface of the substrate exposed by the mesa in the separating region, and the upper surface of the substrate exposed by the mesa in the separating region is connected to the upper surface of the mesa in the integral region via a slope surface in the slope region;
depositing an LED structure on the mesa and the substrate to form a first LED structure on the upper surface of the substrate exposed by the mesa in the separating region and a second LED structure on the upper surface of the mesa in the separating region, wherein the first and second LED structures are separated from each other in the separating region and merge into a single LED structure in the integral region, wherein the first LED structure comprises a first n-type layer, a first active-region, and a first p-type layer, the second LED structure comprises a second n-type layer, a second active-region, and a second p-type layer, The step of depositing the LED structure may comprises:
depositing an n-type layer on the mesa and the substrate to form the first n-type layer on the upper surface of the substrate exposed by the mesa in the separating region and the second n-type layer on the upper surface of the mesa in the separating region;
depositing an active-region on the n-type layer to form the first active-region on the first n-type layer and the second active-region on the second n-type layer;
depositing a p-type layer on the active-region to form the first p-type layer on the first active-region and the second p-type layer on the second active-region;
wherein in the integral region and via the slope region, the first and second n-type layers merge into a single n-type layer, the first and second active-regions merge into a single active-region, and the first and second p-type layers merge into a single p-type layer.

The method may further comprise depositing a template layer on the substrate before forming the mesa, wherein the mesa is formed on the template layer.

The step of forming the mesa may comprise:
depositing a mesa layer on the template layer;
patterning and etching the mesa layer to form the mesa of predetermined pattern;
forming passivation layer on the mesa and the template layer, but exposing the template layer and sidewalls of the mesa in the slope region;
growing a film with tilted upper surface on the exposed template layer and the sidewalls of the mesa in the slope region.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. Like numbers in the figures refer to like elements throughout, and a layer can refer to a group of layers associated with the same function.

FIGS. 6A-6B illustrate an approach to make a slope connecting a higher surface and a lower surface of a substrate for growth of LED structures thereon in an LED chip according to an embodiment of the present invention.

FIG. 8C is a schematic cross-sectional view of an LED chip according to an embodiment of the present invention with a thin-film structure.

DETAILED DESCRIPTION OF EMBODIMENTS

Figure 1:
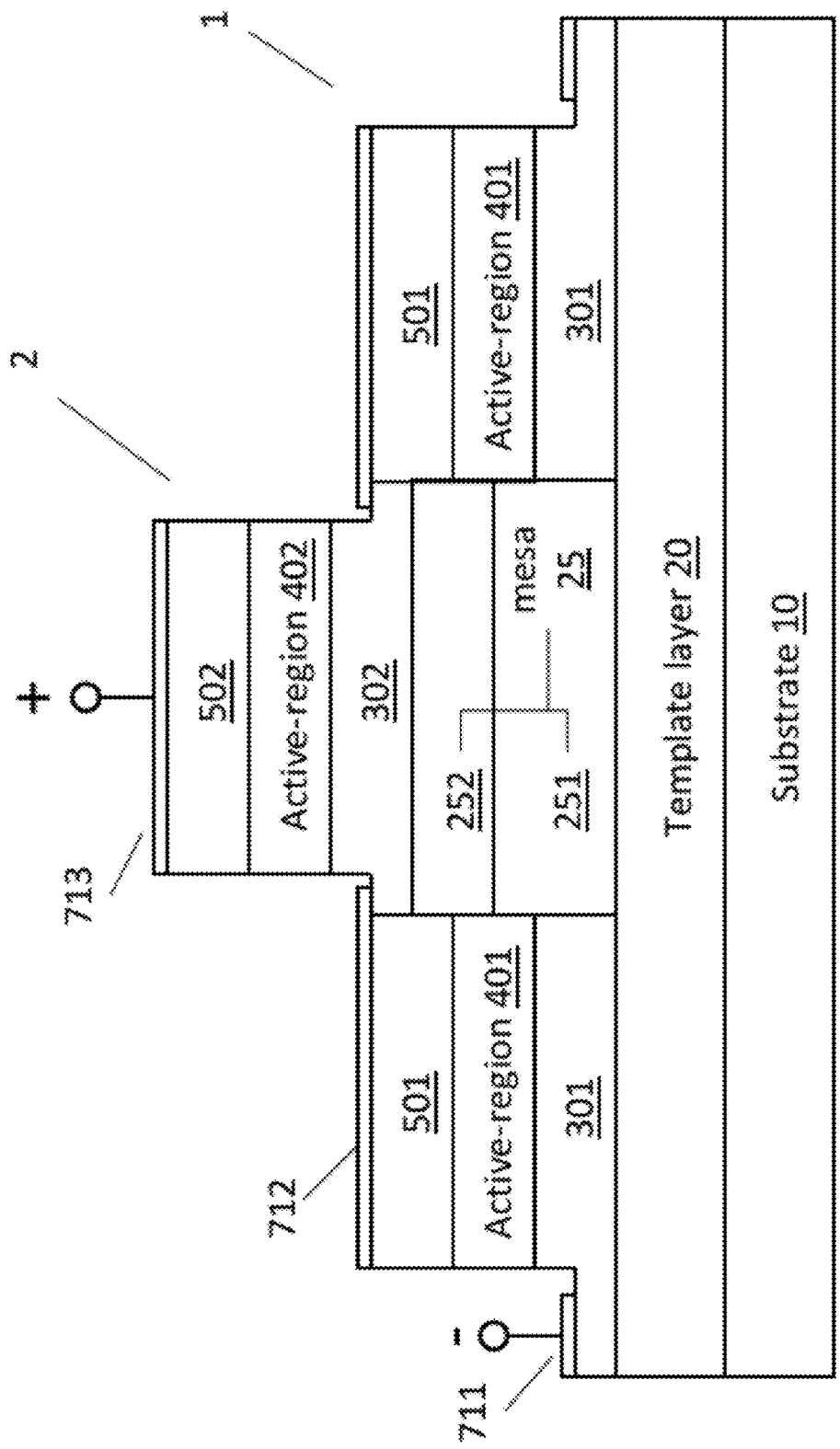
FIG. 1 is a schematic cross-sectional view of an LED chip with LED structures in series connection according to an embodiment of the present invention.

FIG. 1 illustrates a schematic cross-sectional view of an LED chip, or a portion of the LED chip, according to an embodiment of the present invention. The LED chip shown in FIG. 1 includes a substrate 10 and an optional template layer 20. A template layer here means one or more substantially thick epitaxial layer(s) deposited on a substrate. In the field of Group III-V nitride light-emitting devices, a substrate can be made of sapphire, silicon, gallium arsenide, silicon carbide, gallium nitride and the like. Epitaxial layer made of such as gallium nitride (GaN), aluminum nitride (AlN), indium nitride (InN), and their alloys can be used as a template layer, deposited on a substrate for following LED structure growth.

Shown in FIG. 1 the substrate 10 is flat, and the template layer 20 is also flat on which a mesa 25 is formed. Here the template layer 20 can be conductive, for example, with n-type conductivity, and mesa 25 can be insulating, or, at least a portion of mesa 25 can be insulting. Upon the epitaxial growth of an LED structure, LED structure 2 and LED structure 1 are deposited on mesa 25 protruding from the upper surface of template layer 20 and on the upper surface of template layer 20 exposed by mesa 25, respectively. The LED structure 1 in this embodiment comprises an n-type layer 301, an active-region 401, and a p-type layer 501. The LED structure 2 in this embodiment comprises an n-type layer 302, an active-region 402, and a p-type layer 502. In some embodiments, mesa 25 includes a top layer 252 in contact with a portion of active-region 401 and p-layer 501 along its vertical sidewall, and a bottom layer 251 in contact with a portion of active-region 401 and n-layer 301 along its vertical sidewall. The top layer 252 can be insulating or of p-type conductivity when the bottom layer 251 is insulating. The bottom layer 251 can be insulating or of n-type conductivity when the top layer 252 is insulating. The top layer 252 and the bottom layer 251 can be separate layers or within one layer with changing compositions. Mesa 25 also can be a single insulating layer. Mesa 25 or its top layer 252 and bottom layer 251 can be made from GaN, or AlGaN.

The height of mesa 25 can be in the range of 0.5 μm-10 μm, preferably from 2 μm to 5 μm. For the embodiment shown in FIG. 1, the height of mesa 25 should be smaller than the thickness sum of n-type layer 301, active-region 401 and p-type layer 501, while larger than the thickness sum of n-type layer 301 and active-region 401. This means that p-type layer 501 and n-type layer 302 are in contact with each other. Via standard device fabrication process, anode contact 713 is fabricated on p-type layer 502 of LED structure 2, and cathode contact 711 is fabricated on n-type layer 301 of LED structure 1, whereas conductive contact 712, which is in contact with both p-type layer 501 and n-type layer 302, connects current path from LED structure 2 to LED structure 1. In this embodiment, LED structure 2 and LED structure 1 are connected in series. The cathode contact 711, conductive contact 712, and anode contact 713 can be made of metals such as copper, nickel, gold, titanium, aluminum, palladium and the like, or transparent conducting oxides such as zinc oxide, indium tin oxide (ITO), and the like. In one embodiment, conductive contact 712 is formed on p-type layer 501 and only laterally contacts layer n-type 302 via its sidewall to maximize the emitting area of LED structure 2. In another embodiment, conductive contact 712 can also be made to cover a portion of the upper surface of n-type layer 302 by standard lithography and etch process as shown in FIG. 1, so that a better electrical connection is achieved between conductive contact 712 and n-type layer 302. When conductive contact 712 only laterally contacts n-type layer 302 via its sidewall, n-type layer 302 has to be thick enough, for example, more than 5 microns.

In the embodiment shown in FIG. 1, an n-type layer is first grown over substrate 10, for example on mesa 25 and the upper surface of template layer 20 exposed by mesa 25, then an active-region and a p-type layer are grown sequentially. Similarly, a p-type layer can be first grown over substrate 10. In this case, layer 301 and layer 302 will be a p-type layer, while layer 501 and layer 502 will be an n-type layer. Here the template layer 20 can be of p-type conductivity. The top layer 252 can be insulating or of n-type conductivity, when the bottom layer 251 is insulating, and the bottom layer 251 can be insulating or of p-type conductivity, when the top layer 252 is insulating.

Instead of forming a separate mesa 25 as shown in FIG. 1, mesa 25 can be formed as an integral part of substrate 10 by patterning and etching substrate 10.

Figure 2:
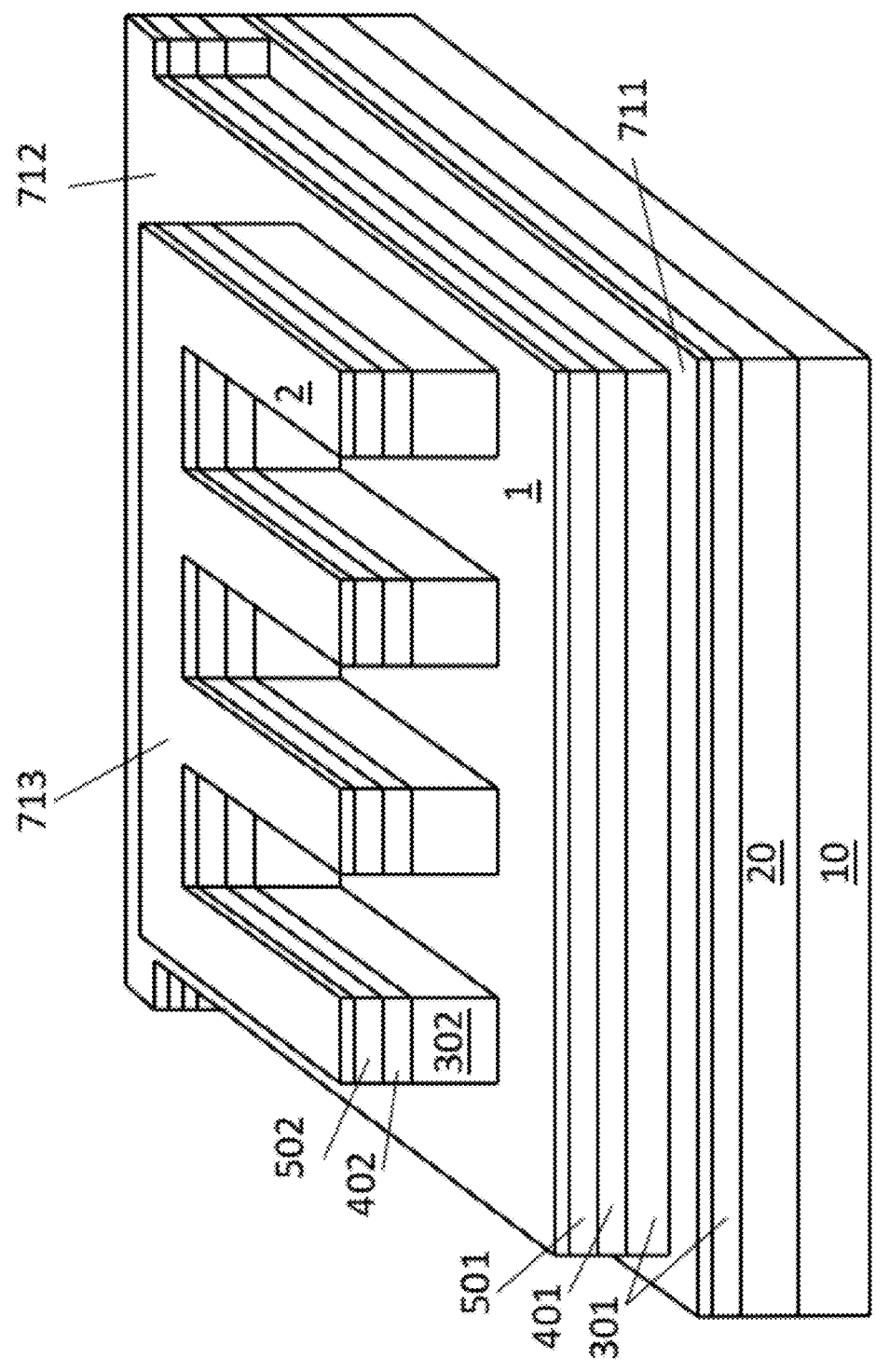
FIG. 2 is a schematic perspective view of an LED chip with LED structures in series connection according to an embodiment of the present invention.
Figure 9A:
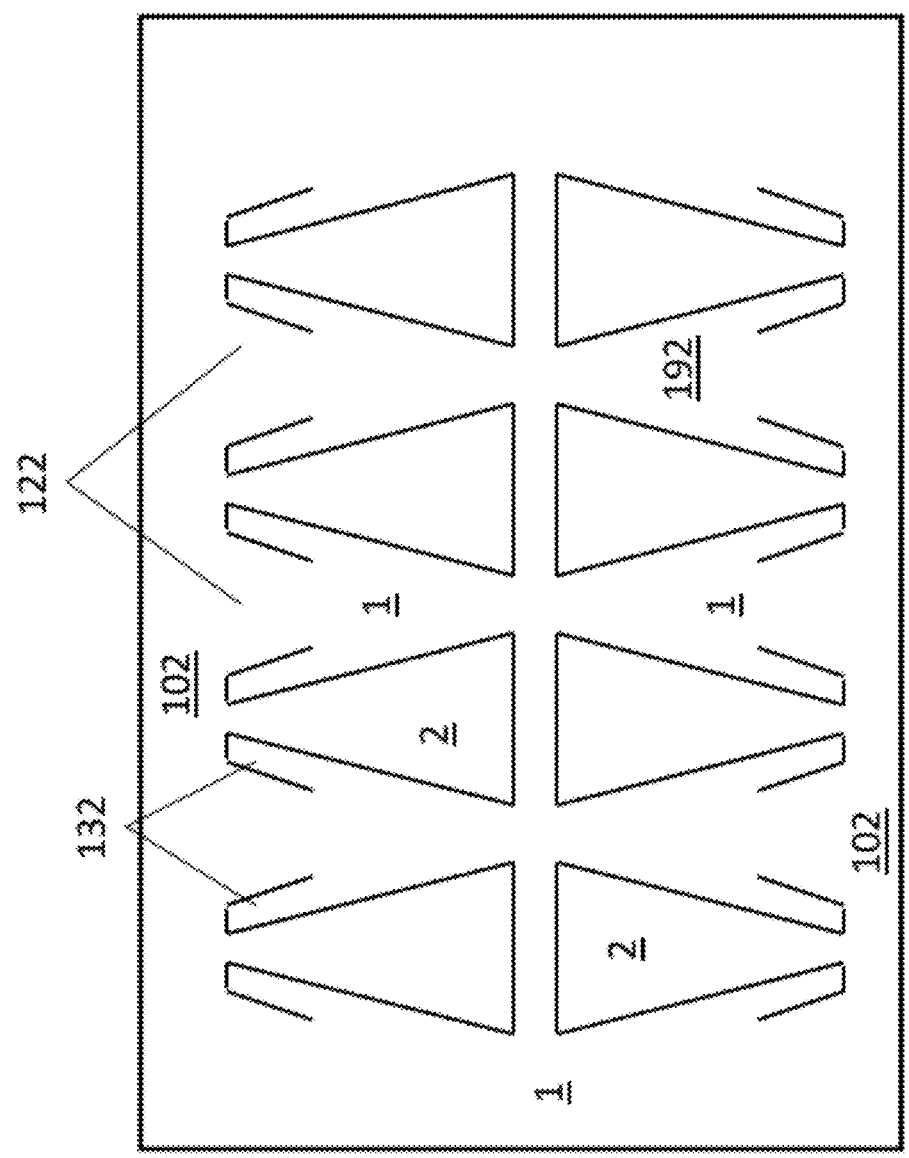
FIGS. 9A-9E are schematic top views showing different patterns of the LED structures in an LED chip according to different embodiments of the present invention.
Figure 9B:
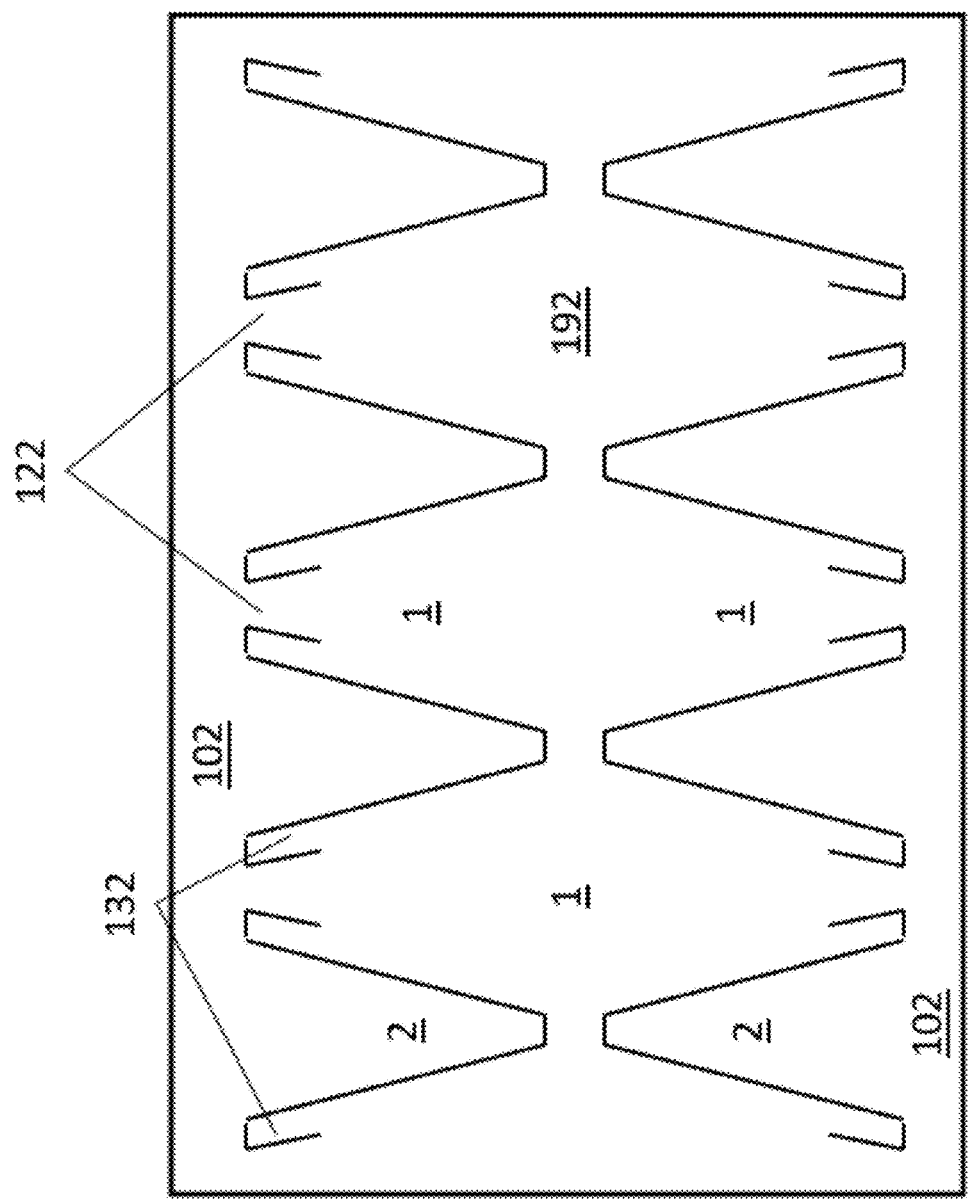

LED structure 2 can have any suitable patterns, such as a comb-shaped pattern as shown in FIG. 2, or a spiral-shaped pattern as shown in FIG. 9B. An exemplary perspective view of the embodiment in FIG. 1 is shown in FIG. 2. As shown, LED structure 2 with a comb-shaped pattern has plurality of elongated rods or fingers and a base portion connecting the fingers. Four fingers are shown in FIG. 2, but it can contain any suitable number of fingers, for example, more than 10 fingers. The width of the finger can be in the range from 10 to 200 microns, preferably 50-100 microns, more preferably 20-50 microns. The distance between two fingers can be in the range from 5 to 50 microns.

The fabrication process of the LED structure shown in FIG. 1 is described below, taking the LED structure with n-type layer first growing from the substrate as an example. A substrate 10 with a template layer 20 is formed by a method known in the art. Mesa 25 is formed on template 20 by epitaxial growth, patterning and etching. Mesa 25 can be formed by sequentially depositing a bottom layer 251 and a top layer 252 as two separate layers, or by changing compositions along the growth direction within one single layer. An n-type layer is epitaxially grown, forming an n-type layer 301 on upper surface of template layer 20 exposed by mesa 25 and an n-type layer 302 on top layer 252 of mesa 25 simultaneously. An active-region is epitaxially grown, forming an active-region 401 on n-type layer 301 and an active-region 402 on n-type layer 302 simultaneously. A p-type layer is epitaxially grown, forming a p-type layer 501 on active-region 401 and a p-type layer 502 on active-region 402 simultaneously. Then, the obtained structure is patterned and a portion of p-type layer 501 and active-region 401 is removed to expose n-type layer 301, or to etch into n-type layer 301 forming a trench in p-type layer 501, active-region 401, and an upper portion of n-type layer 301. Optionally, a portion of p-type layer 502 and active-region 302 can also be removed to expose n-type layer 302 or to etch into n-type layer 302 as shown in FIG. 1. A conductive layer is deposited, forming a cathode contact 711 on n-type layer 301, a conductive contact 712 on p-type layer 501, and an anode contact 713 on p-type layer 502. All the patterning, etching, depositing, and epitaxial growing steps involved in the above process can use known method in the art. In similar manner, a p-type layer can be first grown on mesa 25 and template layer 20, then sequentially growing an active-region and an -n-type layer.

Figure 3:
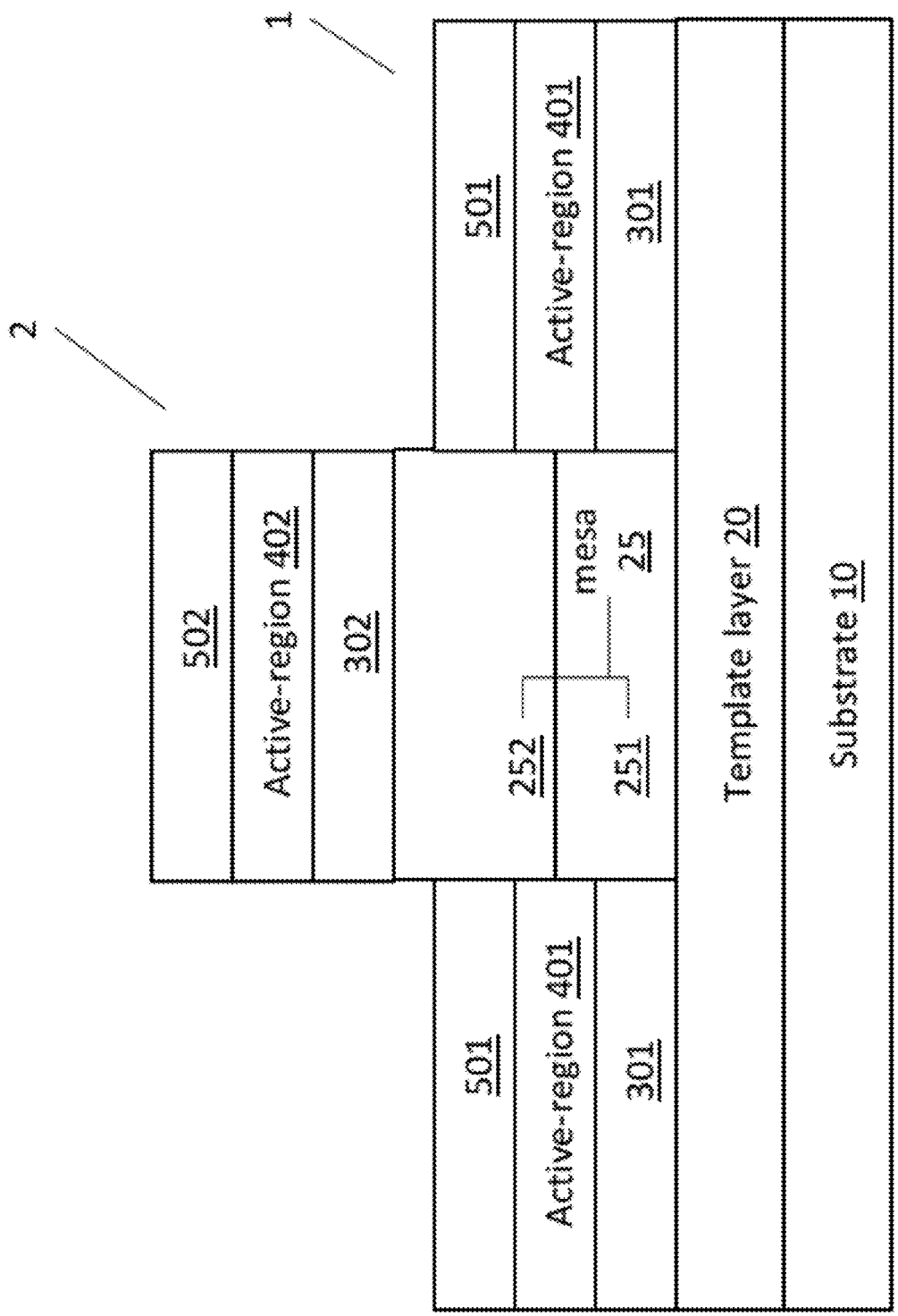
FIG. 3 is a schematic cross-sectional view of an LED chip with LED structures in parallel connection according to an embodiment of the present invention.
Figure 4A:
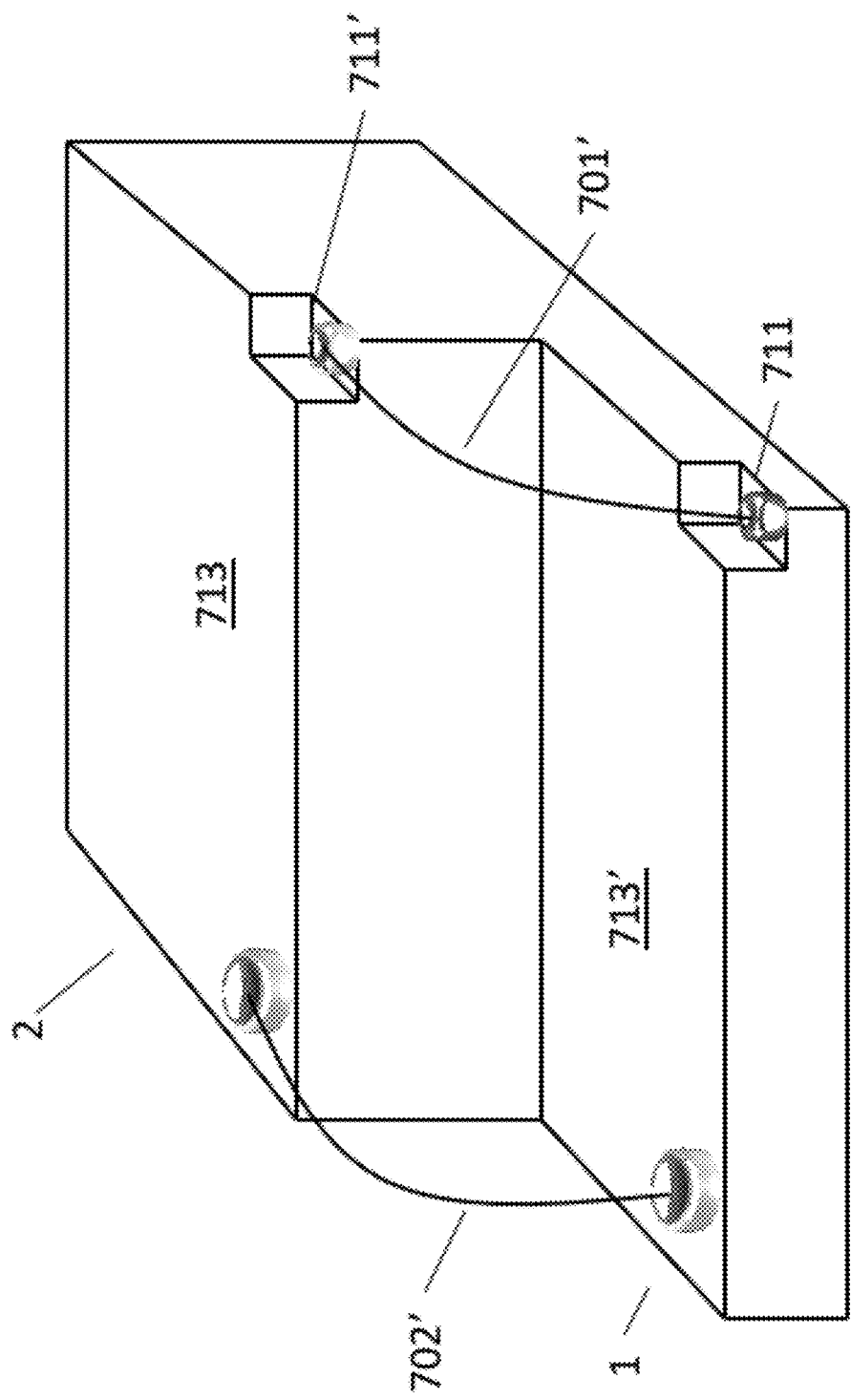
FIGS. 4A-4B illustrate different ways of electrical connections in an LED chip according to an embodiment of the present invention.
Figure 4B:
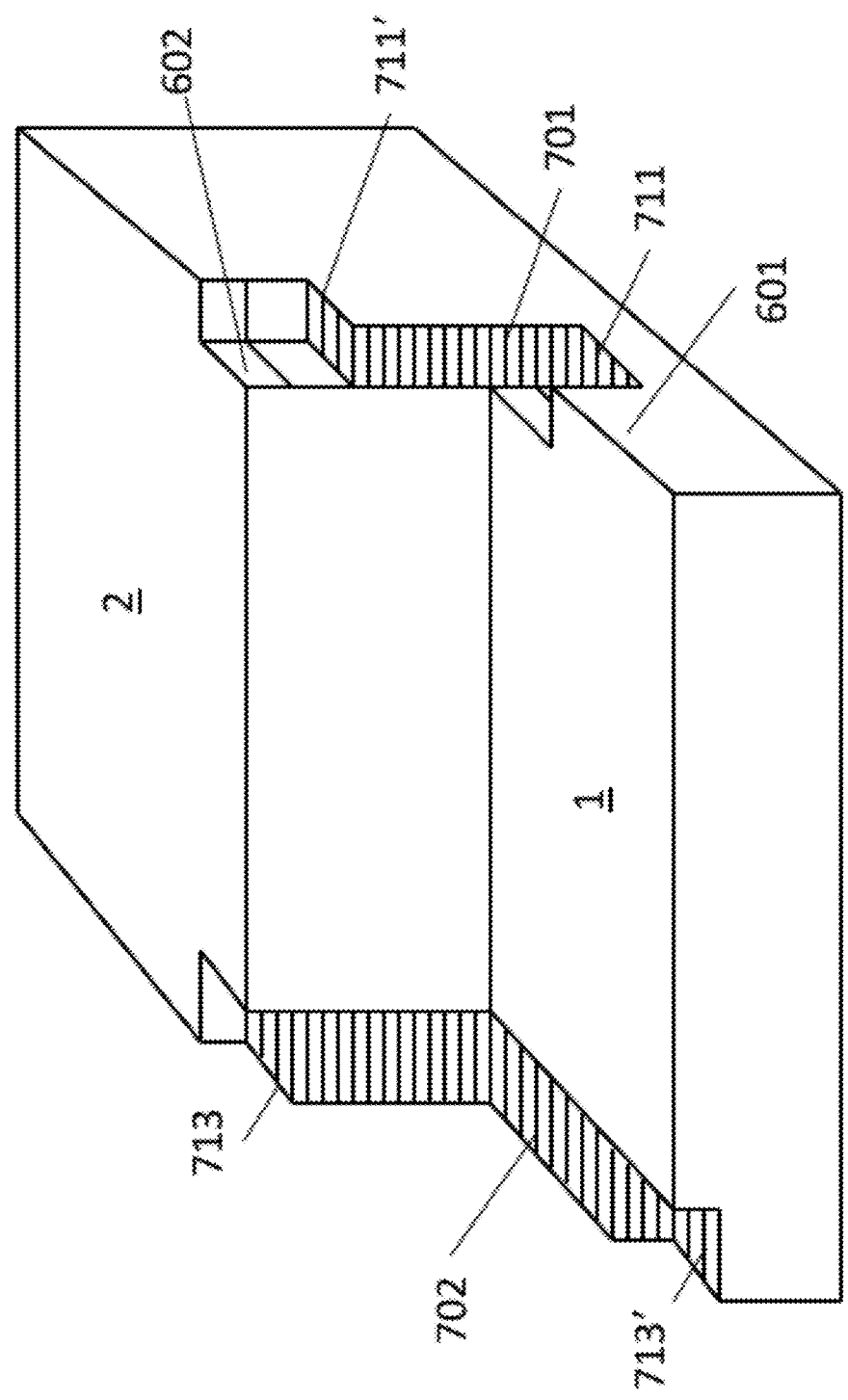

FIG. 3 illustrates a schematic cross-sectional view of an LED chip according to another embodiment of the present invention. The LED chip shown in FIG. 1 and the LED chip shown in FIG. 3 have similar structures except that, in FIG. 3, the height of mesa 25 is larger than the sum of the thicknesses of n-type layer 301, active-region 401 and p-type layer 501. This means that p-type layer 501 and n-type layer 302 are not in contact and are electrically isolated from each other by mesa 25. In other words, LED structure 1 and LED structure 2 are completely separated from each other. The height of mesa 25 is in the range of 0.5 µm-10 µm, preferably from 2 µm to 5 µm. If LED structure 2 and LED structure 1 are completely separated by mesa 25, parallel electrical connection of LED structure 2 and LED structure 1 can be realized by electrically connecting cathodes of LED structures 1 and 2, and electrically connecting anodes of LED structures 1 and 2, respectively, as illustrated in FIG. 4A and FIG. 4B. In the structure shown in FIG. 4A, cathode 711' of LED structure 2 which is in electrical contact with n-type layer 302 is connected to cathode 711 of LED structure 1 which is in electrical contact with n-type layer 301 via conductive wire 701', while anode 713 of LED structure 2 which is in electrical contact with p-type layer 502 is connected to anode 713' of LED structure 1 which is in electrical contact with p-type layer 501 via conductive wire 702'. In the structure shown in FIG. 4B, the connection is achieved via metallization layers 701 and 702.

The fabrication process of the LED structure shown in FIG. 3 is similar to the fabrication process of the LED structure shown in FIG. 1 except that a portion of the top surface of n-type layer 302 is exposed by etching and removing a corresponding portion of p-type layer 502 and active-region 402 and, then, a conductive layer is deposited, forming a cathode contact 711 on n-type layer 301, an anode contact 713' on p-type layer 501, a cathode contact 711' on n-type layer 302, and an anode contact 713 on p-type layer 502. Cathode contacts 711 and 711' is connected by a conductive wire 701', and anode contacts 713 and 713' is connected with a conductive wire 702' as shown in FIG. 4A. Optionally, a passivation layer, preferably made of silicon dioxide, or silicon nitride, is deposited via sputtering to cover the whole LED structures shown in FIGS. 3 and 4B, in order to cover the sidewalls of LED structure 2. This passivation of the sidewalls of LED structure 2 can prevent electric short circuit between the PN junction of LED structure 2 and the metallization layers 702 and 701. The passivation sputtering process forms a passivation layer 601 covering LED structure 1 and a passivation layer 602 covering LED structure 2 and the sidewalls of LED structure 2. Passivation layers 601 and 602 are patterned and etched to expose a portion of cathode contacts 711, 711' and anode contacts 713, 713'. Then a metallization process is conducted to form metallization layers 701 and 702 that connect cathode contacts 711 and 711' and anode contacts 713 and 713', respectively, as shown in FIG. 4B.

Figure 5A:
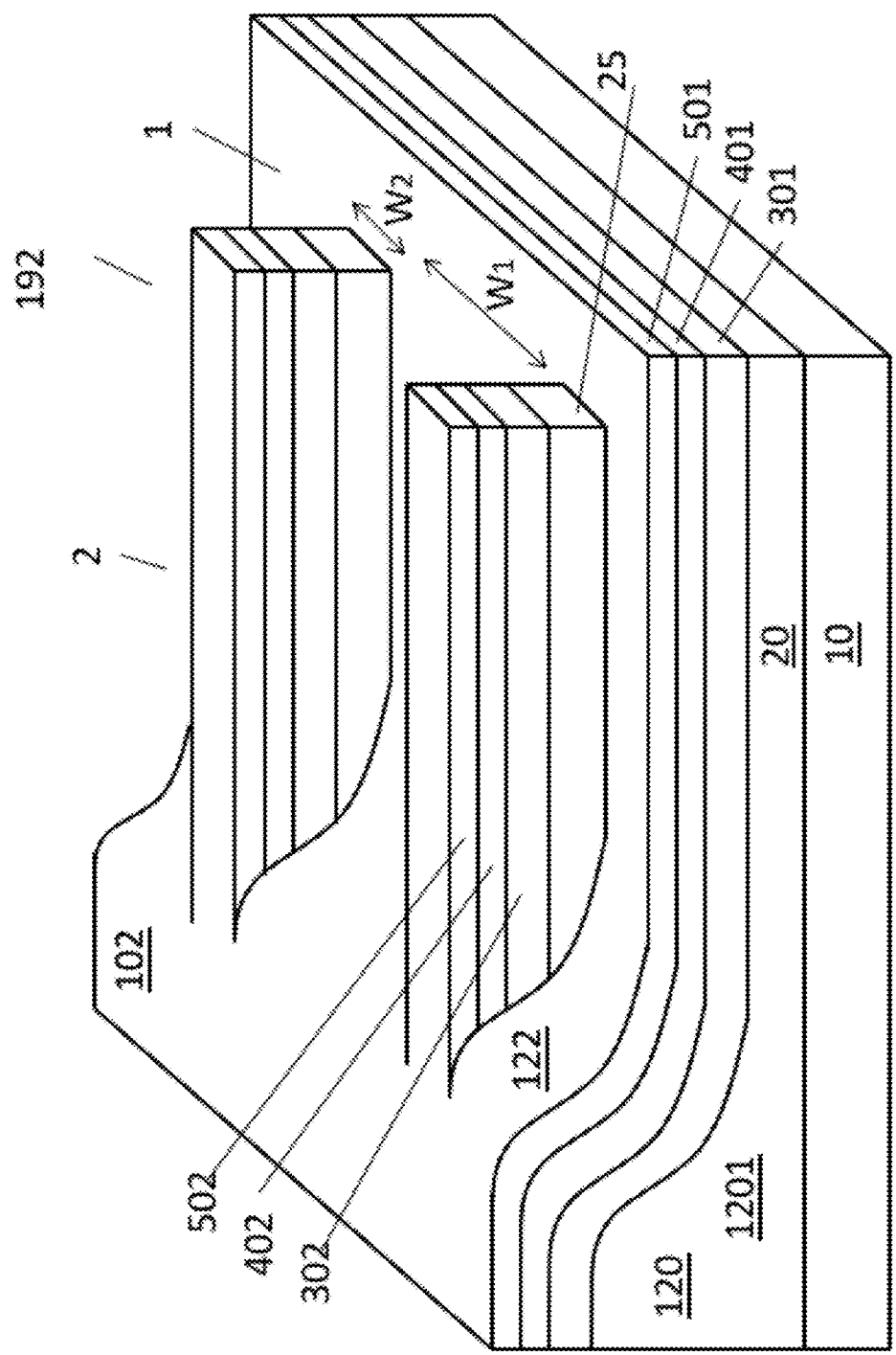
FIG. 5A is a schematic perspective view of an LED chip with LED structures merging into one single LED structure according to an embodiment of the present invention.
Figure 5B:
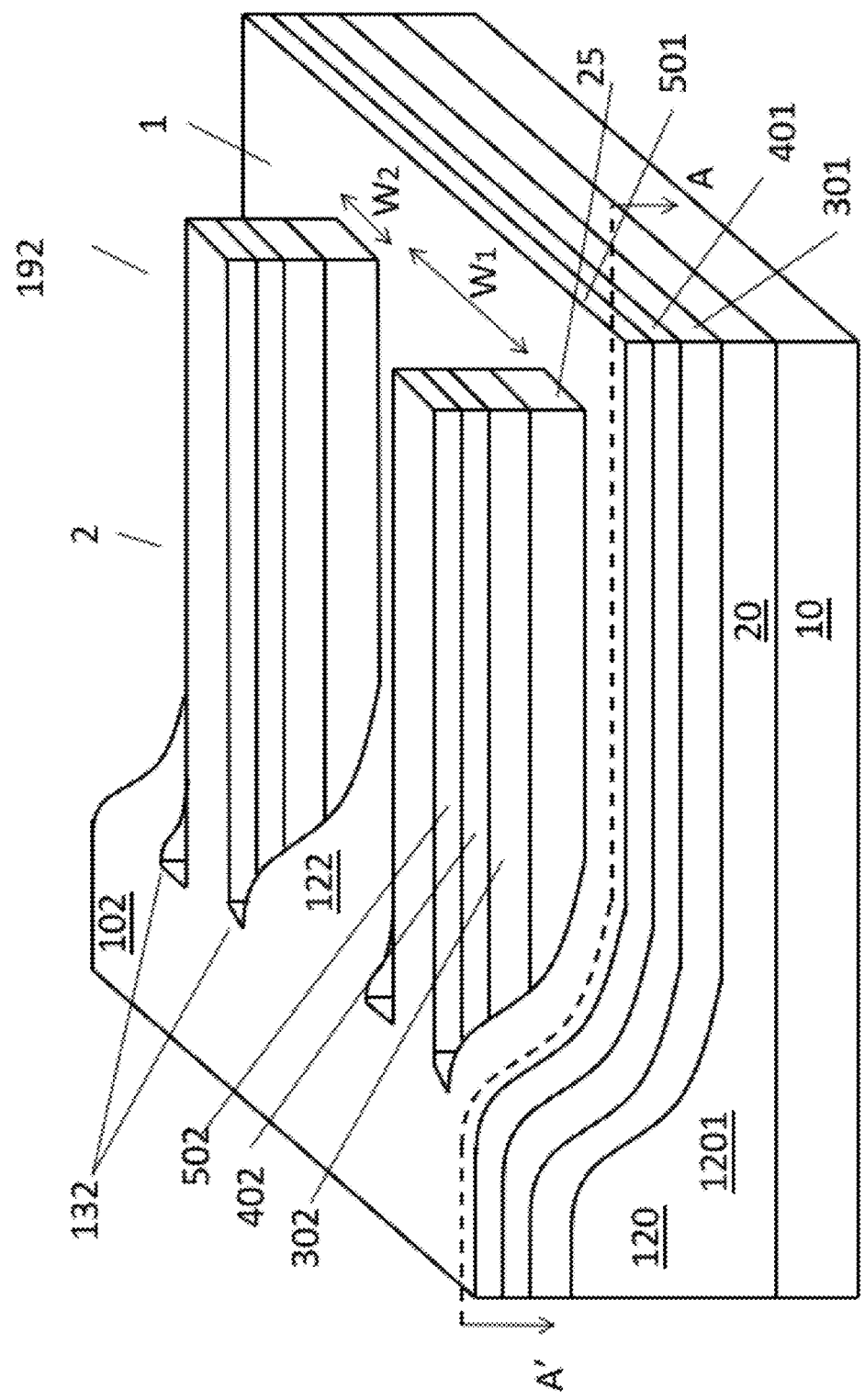
FIG. 5B is a schematic perspective view of an LED chip with LED structures merging into one single LED structure according to another embodiment of the present invention where there is a gap between the LED structures in a slope region.

In still another embodiment, LED structures 2 and 1 are partially separated by mesa 25, i.e., in one or more portions of a LED chip, LED structures 2 and 1 merge into a single LED structure, sharing a common n-type layer, a common active-region, and a common p-type layer, while in one or more other portions of the LED chip, the n-type layers, the active-regions, and the p-type layers of LED structures 2 and 1 are physically separated in vertical direction by mesa 25 as schematically illustrated in FIG. 5A and FIG. 5B. FIG. 5A-5B show schematic perspective views of a LED chip for a more straightforward understanding of the idea. As shown in FIG. 5A, LED structure 1 comprises an n-type layer 301, an active-region 401 and a p-type layer 501, and LED structure 2 comprises an n-type layer 302, an active-region 402 and a p-type layer 502. LED structure 1 and LED structure 2 merge into one LED structure in integral region 102, i.e., n-type layer 301 and n-type layer 302 are integrated as one n-type layer, active-region 401 and active-region 402 are integrated as one active-region, and p-type layer 501 and p-type layer 502 are integrated as one p-type layer in this region. While LED structures 1 and 2 are vertically separated by mesa 25 or by any other suitable structure or layer in separating region 192, i.e., n-type layer 301 and n-type layer 302 are vertically separated, active-region 401 and active-region 402 are vertically separated, and p-type layer 501 and p-type layer 502 are vertically separated in this region. Integral region 102 and separating region 192 are connected via a slope region 122.

In the structure shown in FIG. 5A, there is the possibility that the sidewall of p-type layer 501 of LED structure 1 may contact with the sidewall of n-type layer 302 of LED structure 2 in slope region 122. To avoid this situation, another preferred embodiment is illustrated in FIG. 5B. By forming an isolation gap 132 in slope region 122, the sidewall contact between LED structure 1 and LED structure 2 is forbidden. Isolation gap 132 is deep enough to penetrate n-type layer 302 of LED structure 2 and has a width between 1 to 10 microns, preferably 1-5 microns. Isolation gap 132 may have a length similar to that of the slope region 122, The length of isolation gap 132 can also be shorter than that of the slope region 122 as long as it can electrically isolate the sidewall of p-type layer 501 of LED structure 1 from the sidewall of n-type layer 302 of LED structure 2 in slope region 122.

Figure 5C:
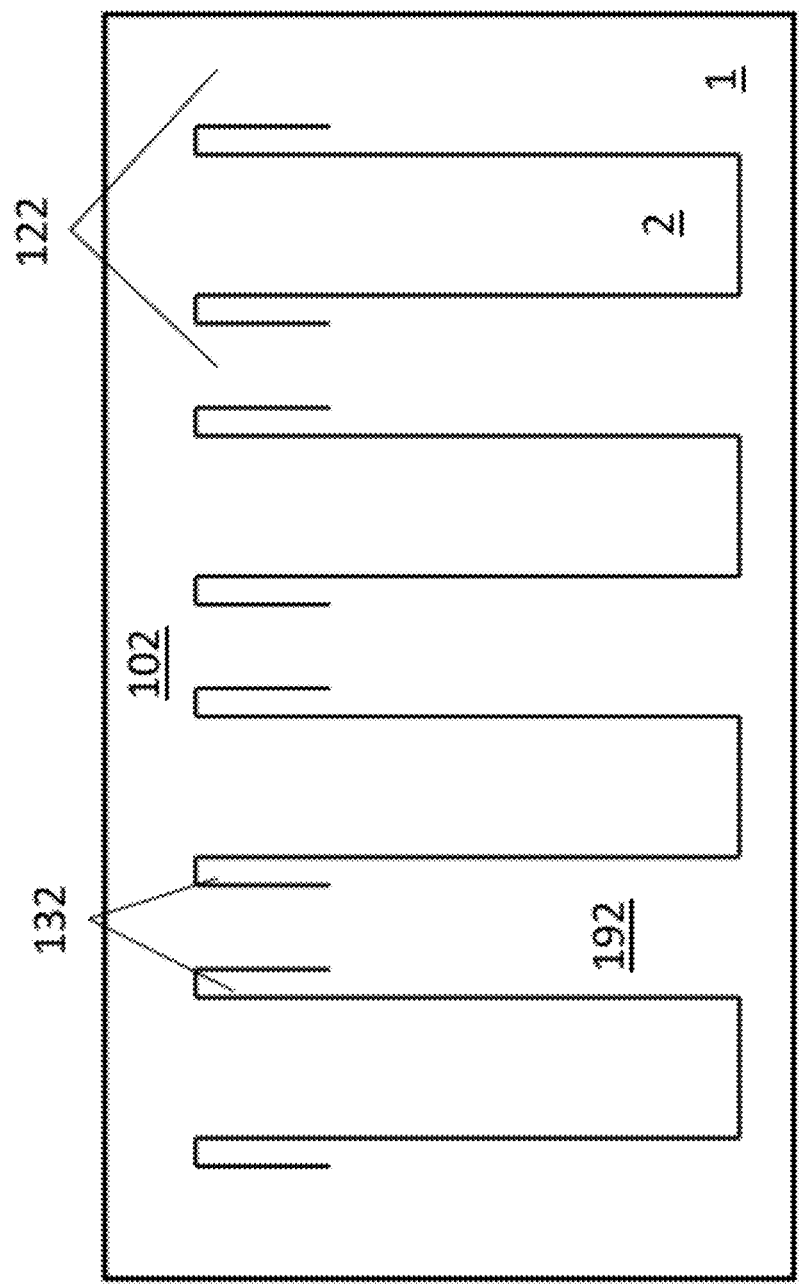
FIG. 5C is a schematic top view of the LED structures in an LED chip according to an embodiment of the present invention where LED structures merge into one single LED structure and there is a gap between the LED structures in a slope region.

FIG. 5C is the top view of FIG. 5B but with four LED structures 2 instead of two LED structures 2. It is shown that LED structure 1 and LED structure 2 merge into one LED structure in integral region 102 via slope region 122, while isolation gaps 132 prevent short current path between LED structure 1 and LED structure 2 in slope region 122.

Figure 5D:
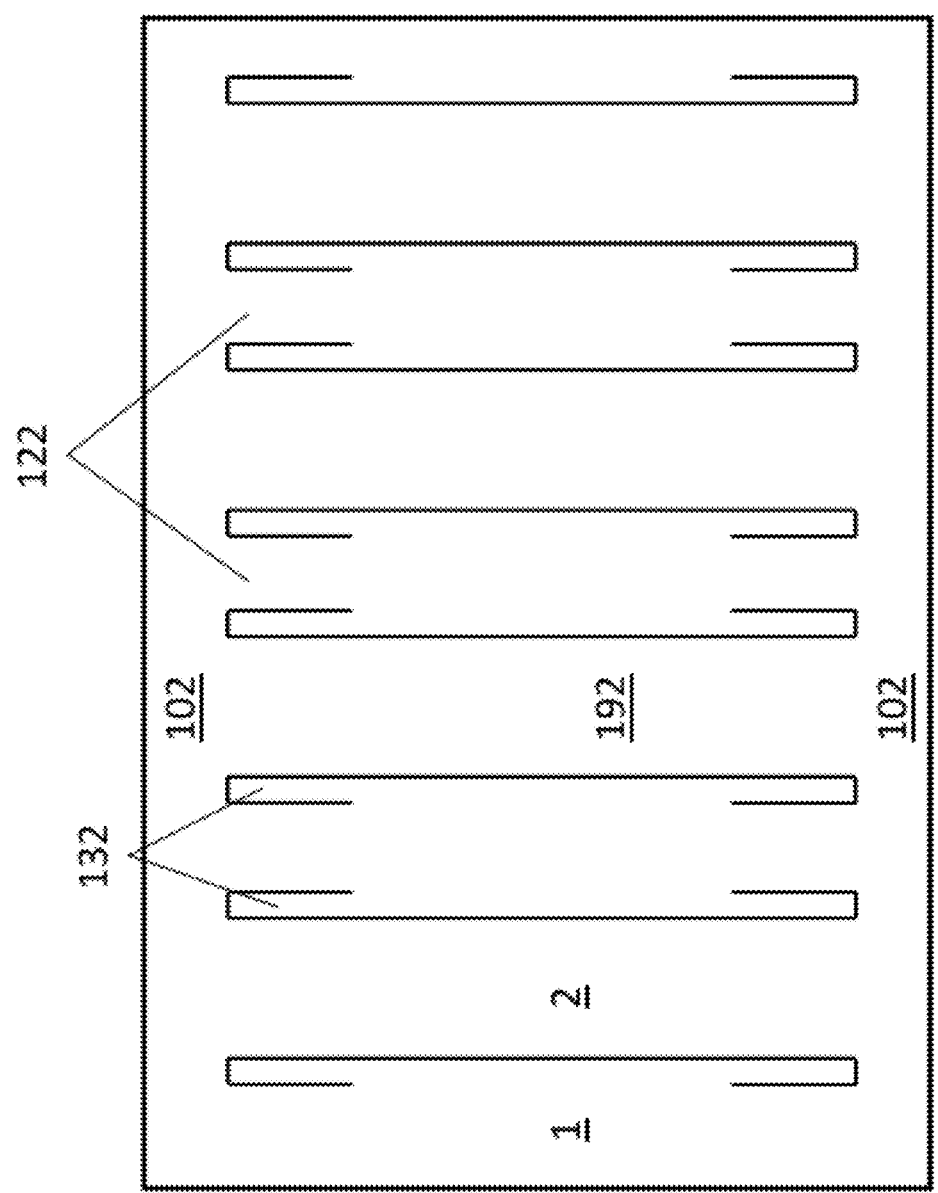
FIG. 5D is a schematic top view of the LED structures in an LED chip according to another embodiment of the present invention where LED structures merge into one single LED structure and there is a gap between the LED structures in a slope region.

FIG. 5D is the top view of another embodiment similar to that shown in FIG. 5C, but with an additional integral region 102 and additional slope region 122 and isolation gaps 132 on the other end of elongated LED structures 2 for reduced connection resistance.

In the embodiments shown in FIGS. 5A-5D, the width $W_2$ of LED structure 2 can be in the range of 10 to 200 microns, preferably 50-100 microns, more preferably 20-50 microns, the distance $W_1$ between neighboring LED structures 2 can be from 20 to 100 microns. The ratio $W_2/W_1$ can be in the range from 0.2 to 2.

Figure 9C:
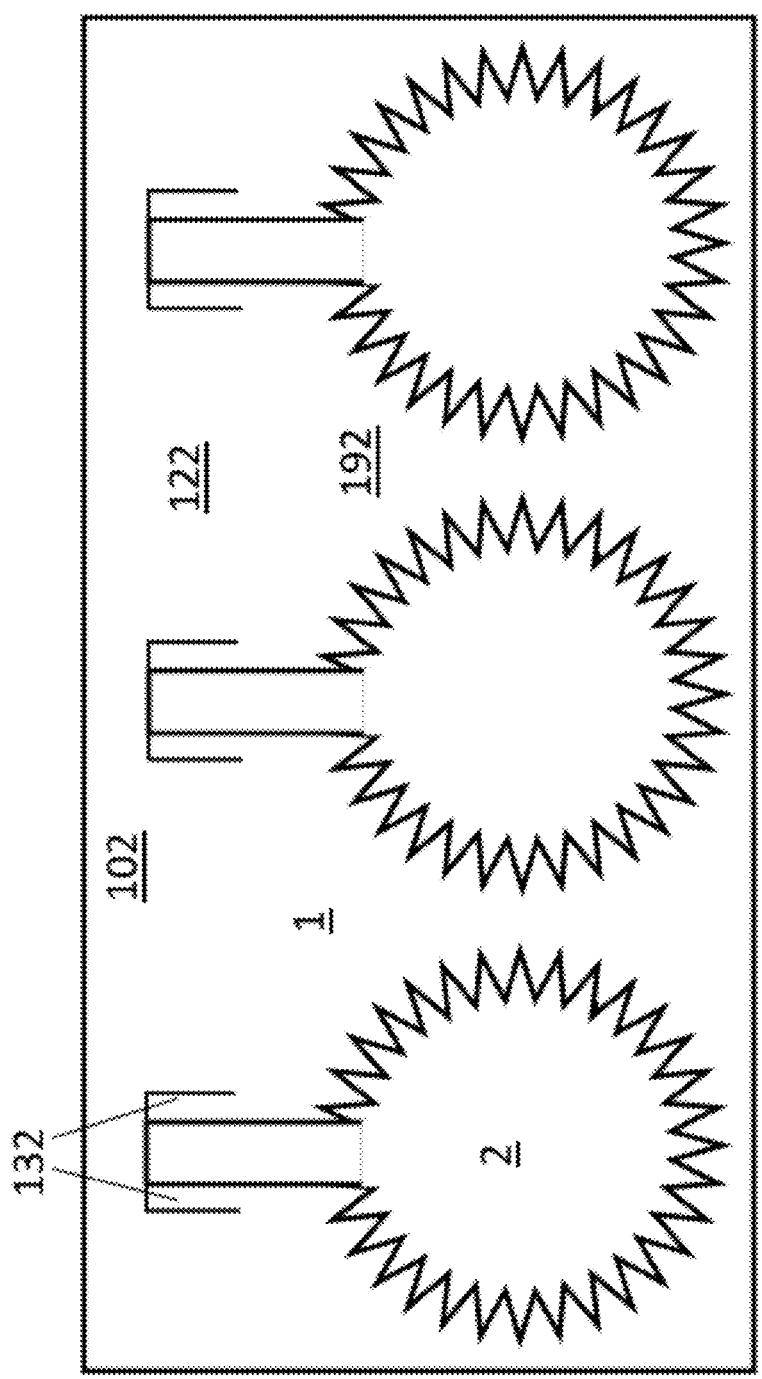
Figure 9D:
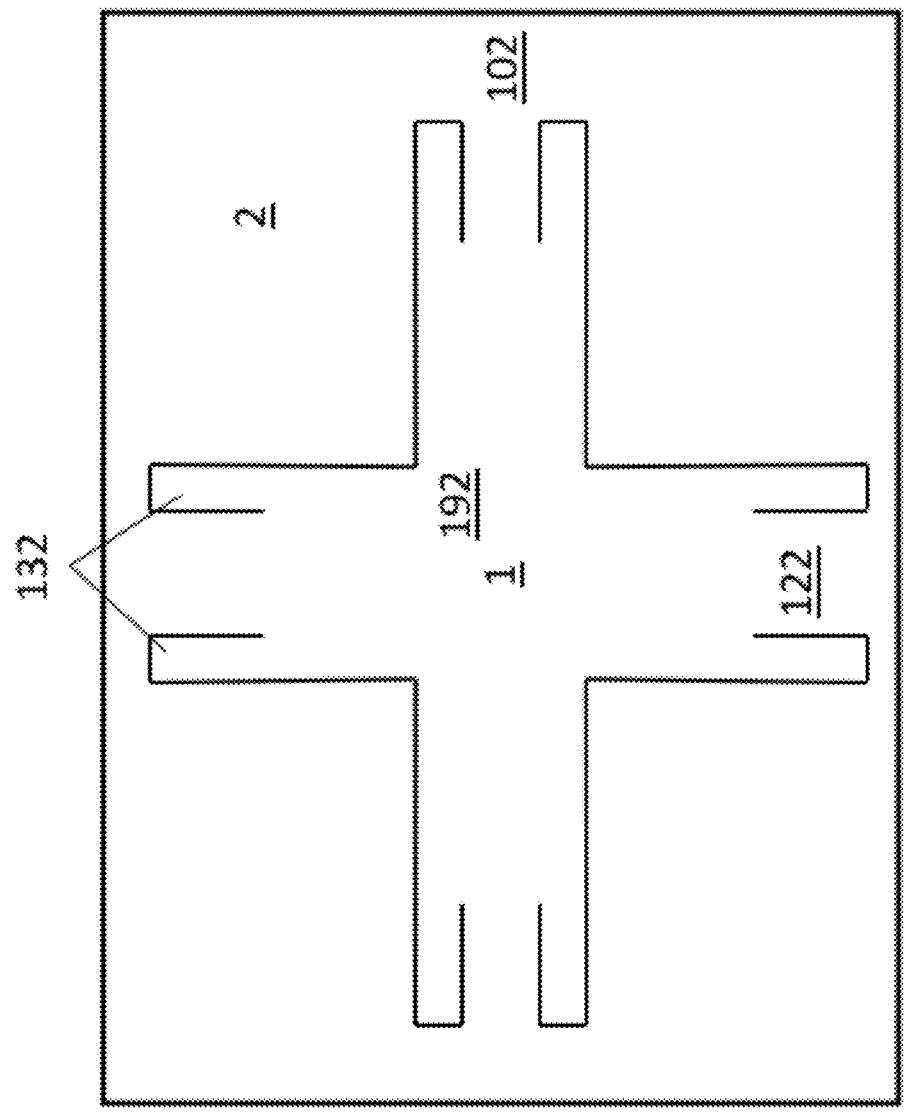
Figure 9E:
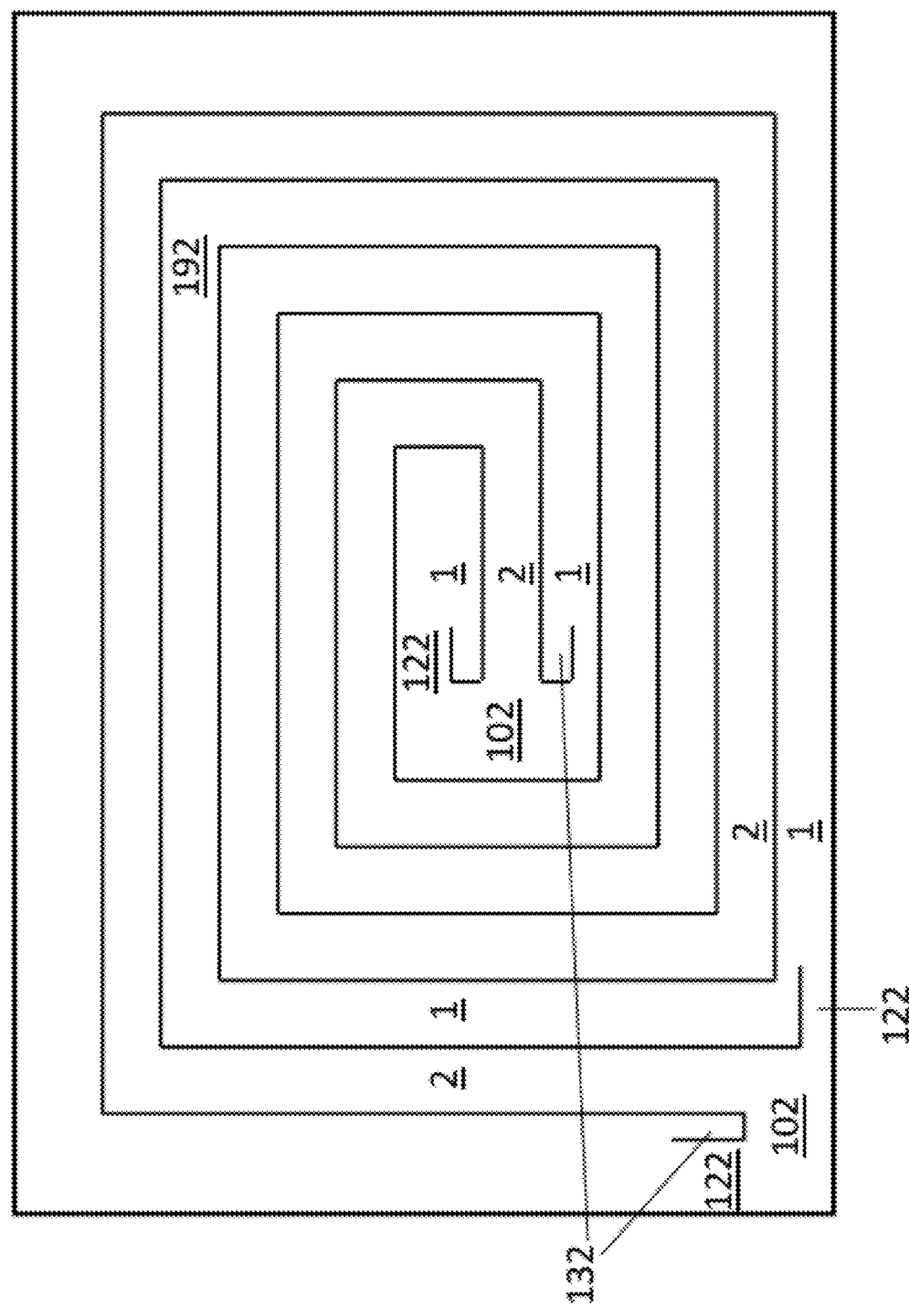

Although FIGS. 5A-5D show LED structures 2 as parallel elongated rods or fingers, LED structure 2 is not limited to any particular shape and pattern and can take any shape and pattern as long as it can provide a vertically displaced LED structure. For example, the top view shape of the LED structures 2 in FIGS. 5A and 5B can be truncated triangle, as shown in FIG. 9A and FIG. 9B. In FIG. 9A, the truncated portions of the triangles are merged into the integral region 102, while in FIG. 9B the bases of the triangles are merged with the integral region 102. These truncated triangles can be of any type of triangles, such as equilateral, isosceles, and scalene triangles. The arrangement of these truncated triangles can take any ordered or random patterns. The top view shape of the LED structures 2 can also be other polygons such as pentagon, hexagonal and octagon. The surfaces of LED structure 1 and LED structure 2 and the sidewalls of LED structure 2 can be roughened to enhance light extraction. Shown in FIG. 9C the top view of the LED structures 2 is circle with sidewalls roughened for enhanced light extraction. FIG. 9D is the top view of a cross pattern design according to an embodiment of the present invention, in which LED structure 1 has a cross shape surrounded by LED structure 2. Cross-shaped LED structure 1 is recessed relative to LED structure 2 in separating region 192. Cross-shaped LED structure 1 and LED structure 2 merge into one single LED structure in integral region 102 via slope region 122 at four ends of the cross-shaped LED structure 1. One LED chip as shown in FIGS. 5A-5D can contain one or more cross pattern shown in FIG. 9D. Similarly, concave polygon shaped LED structure 1, such as a star shape, are also possible with slope region at the vertices. Shown in FIG. 9E is a spiral pattern design according to an embodiment of the present invention, in which LED structure 2 is a spiral shaped wall and LED structure 1 is a corresponding spiral shaped trench, and LED structures 1 and 2 merge into a single LED structure at two ends of the spiral shaped wall and trench in integral region 102 via slope region 122. The width $W_2$ of LED structure 2 can be in the range of 10 to 200 microns, preferably 50-100 microns, more preferably 20-50 microns, the distance $W_1$ between neighboring LED structures 2 (in this case, it is also the width of LED structure 1) can be from 20 to 100 microns. The ration $W_2/W_1$ can be in the range from 0.2 to 1.

FIGS. 6A-6B and FIGS. 7A-7B illustrate two approaches to make such a slope region 122. The slope region can be made on substrate 10 or template layer 20 after fabrication of integral region 102 and separating region 192. Here FIGS. 6A-6B and FIGS. 7A-7B present the cross-sectional views along the cutting line AA' of FIG. 5B.

As seen in FIG. 6A, via standard lithography and etch process, a mesa is formed on template layer 20, which includes a mesa 120 in integral region 102 and a mesa 25 (not shown) in separating region 192 in a suitable pattern. Mesa 120 and mesa 25 may have the same height and share a continuous upper surface. With the exception of the areas that are to be used for forming slope region 122, the whole surface area, including mesa 25, mesa 120 and the exposed template layer 20 is coated with a passivation layer such as silicon dioxide, which includes passivation layer 622 in integral region 102 and passivation layer 621 in separating region 192. The mesa can be made from one or more layer and epitaxially grown on template layer 20 or on substrate 10, or the mesa can be an integral part of template layer 20 or substrate 10. The structure in FIG. 6A is then loaded into an epitaxial reactor such as Metalorganic Chemical Vapor Deposition (MOCVD) and Molecular Beam Epitaxy (MBE) reactors. Preferably the structure shown in FIG. 6A is loaded into a Hydride Vapor Phase Epitaxy (HVPE) reactor, taking advantage of the fast growth rate of HVPE, which can be as high as 300 micron/hour. Epitaxial growth will start from the exposed surface of template layer 20 in region 122 and the sidewall of mesa 120, forming a film 1201 with tilted upper surface 122'. Growth on top of passivation layers 621 and 622 will result in polycrystalline films, which together with passivation layers 621 and 622 can be easily removed, for example, by wet chemical etching. After removing passivation layers 621 and 622 by etching, a structure shown in FIG. 6B is obtained, which is then loaded into an epitaxial reactor for epitaxial growth of a LED structure thereon according to any known epitaxial growth method in the art, forming LED structure 1 and LED structure 2 simultaneously as shown in FIG. 5A. It is noted that because the thickness of passivation layer 621 is very small, for example, 70-150 nm, for example approximately 100 nm, so the step between layer 1201 and layer 20 is very small too. This step can be easily smoothened out during the following LED structure growth.

Figure 7A:
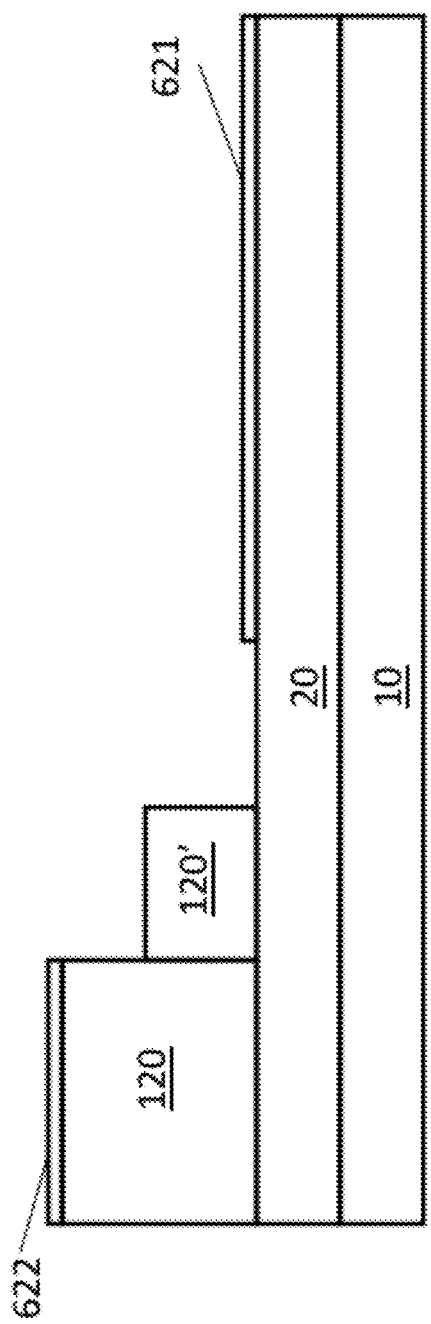
FIGS. 7A-7B illustrate another approach to make a slope connecting a higher surface and a lower surface of a substrate for growth of LED structures thereon in an LED chip according to an embodiment of the present invention.
Figure 7B:
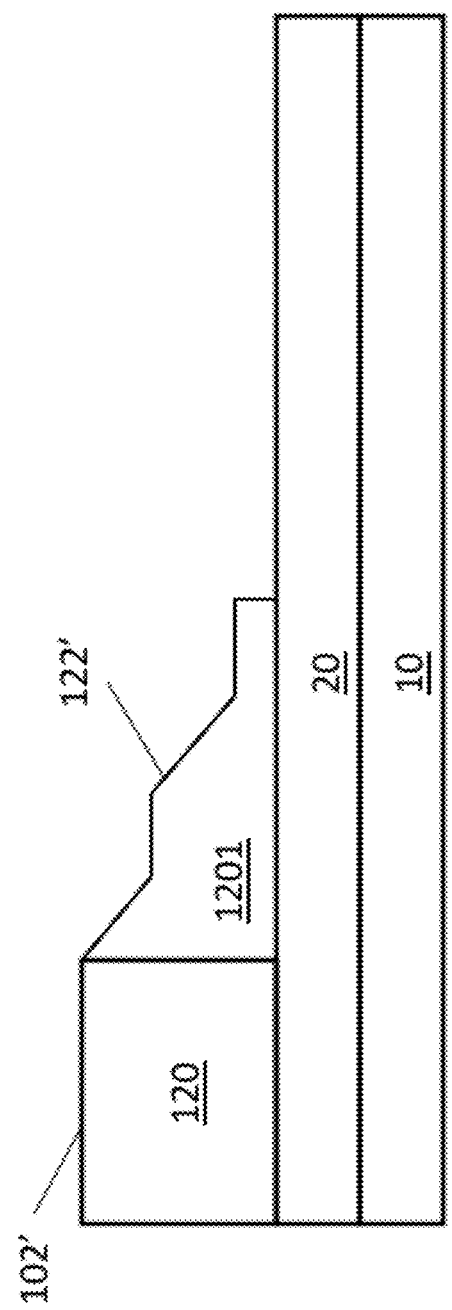

An alternative approach to make such a slope region 122 is illustrated in FIGS. 7A-7B, by adding one or more additional mesa 120' with a height smaller that that of mesa 120. Similar to the method as explained previously in FIGS. 6A and 6B, by epitaxial growth and chemical etching, a film 1201 with a tilted surface 122' is obtained, with a smaller slope. It is understood that three or more mesas with different height can be applied to make a smoother and less steep slope region 122. Mesa 120' can be fabricated by known method, for example, by patterning and etching a selected portion or portions of mesa 120 after forming mesa 120 and mesa 25 in the process discussed in connection with FIGS. 6A and 6B.

Figure 8A:
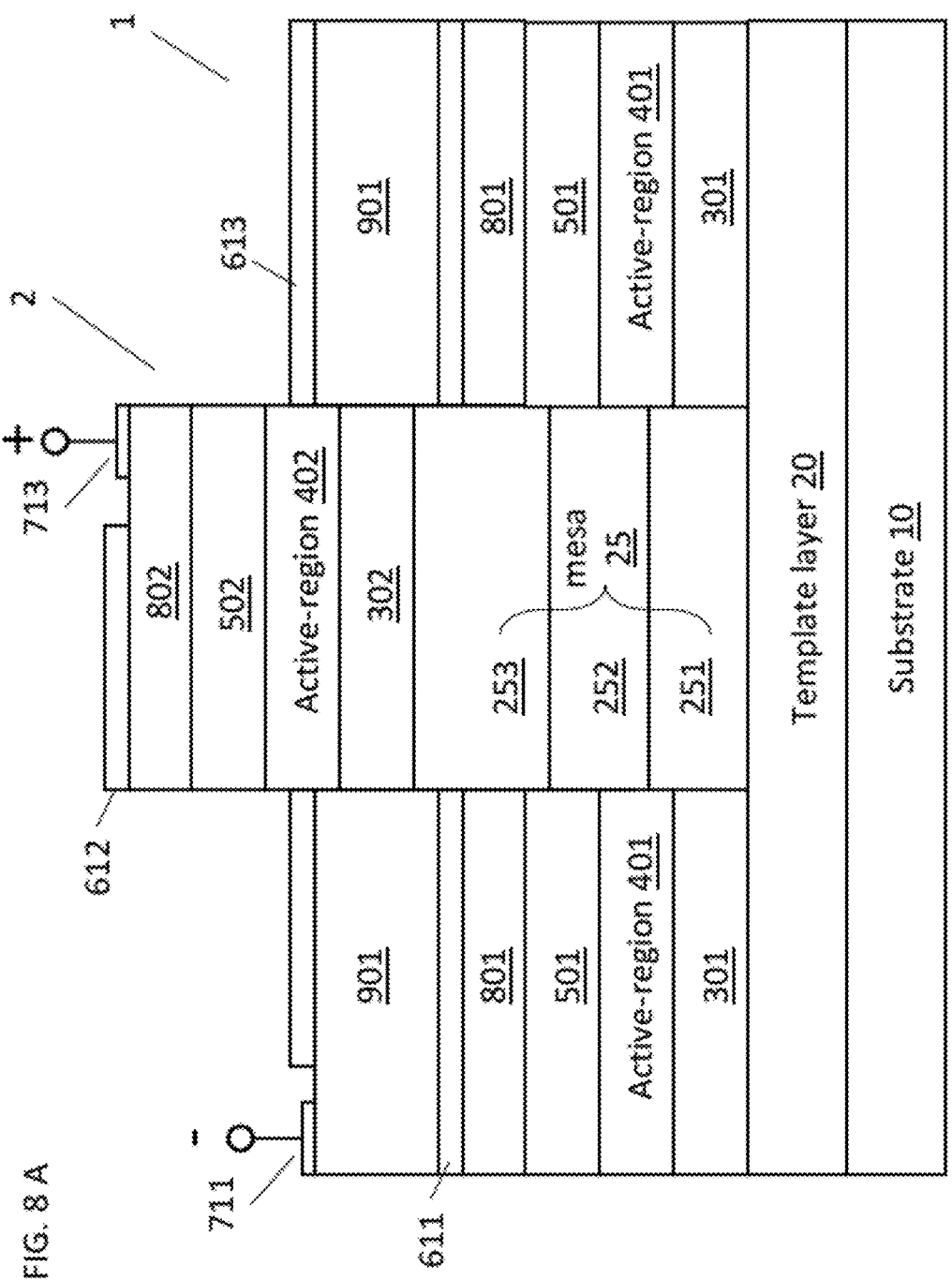
FIG. 8A is a schematic cross-sectional view of an LED chip according to an embodiment of the present invention.
Figure 8B:
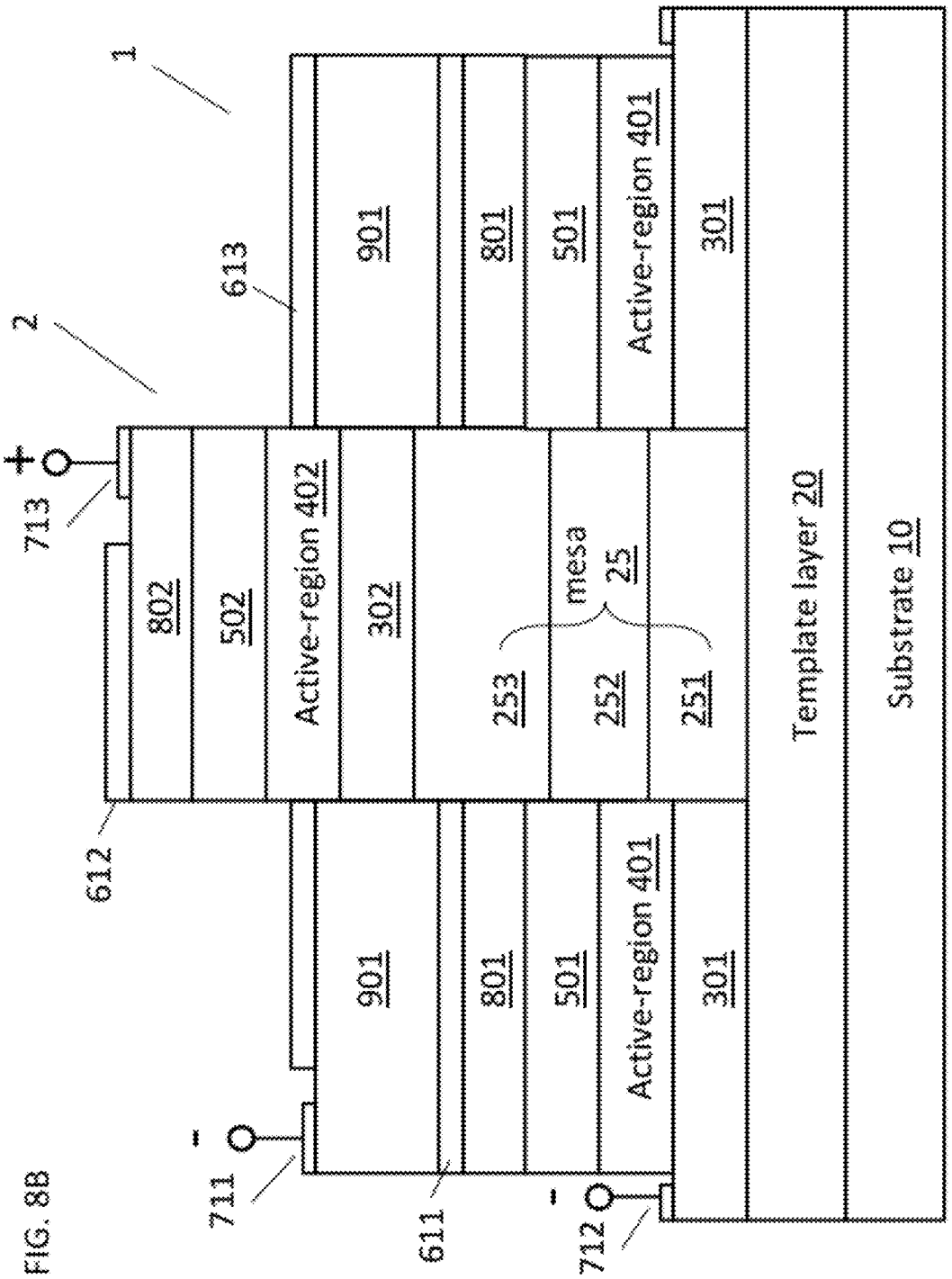
FIG. 8B is a schematic cross-sectional view of an LED chip to that shown in FIG. 8A, but with an additional cathode contact on the lower n-type layer.

In the embodiments represented by FIGS. 5A and 5B, the electrical connection can be achieved according to FIGS. 8A-8C. Here mesa 25 includes three layers or portions: top layer 253, mid layer 252, and bottom layer 251. Bottom layer 251 can be either n-type or insulating, mid layer 252 can be either insulating or p-type, similar to layers 251 and 252 in the embodiments shown in FIGS. 1 and 3. Top layer 253 is insulating. Mesa 25 can also be made a single insulating layer or an integral part of template layer 20 or substrate 10. Upon epitaxial growth of an n-type layer, an active-region, and a p-type layer on a structure such as that shown in FIGS. 6B and 7B, LED structure 2 and LED structure 1 are formed on mesa 25 and the surrounding exposed template layer 20, respectively, in separating region 192. LED structure 2 includes n-type layer 302, active-region 402 and p-type layer 502. LED structure 1 includes n-type layer 301, active-region 401, and p-type layer 501. As the sidewall of mesa 25 is steep and high enough, no layers in the LED structure continuously grow over the sidewall of mesa 25, thus, LED structure 1 is separated from LED structure 2 in separating region 192. Such discontinued LED structure is favorable in terms of reducing lateral light absorption and stress in the active-region and that in turn will improve light extraction efficiency and structural stability of a LED device. LED structures 1 and 2 merge into a single LED structure on mesa 120 in integral region 102, the single LED structure includes an n-type layer that connects both n-type layers 301 and 302, an active-region that connects both active-regions 401 and 402, and a p-type layer that connects both p-type layers 501 and 502. A p-type current spreading layer, preferably a transparent conducting layer such as indium tin oxide (ITO), is deposited, for example via sputtering or e-beam evaporation, forming a p-type current spreading layer 801 on p-type layer 501 and a p-type current spreading layer 802 on p-type layer 502 simultaneously. A portion of the p-type current spreading layer is also formed in integral region 102. The thickness of p-type current spreading layer 801 is selected so to preserve a substantial vertical gap between the top surface of p-type current spreading layer 801 and the bottom surface of n-type layer 302, i.e., p-type current spreading layer 801 and n-type layer 302 have to be isolated along the sidewall of mesa 25. Then, a first insulating dielectric layer is deposited on top of p-type current spreading layers 801 and 802 as well as the portion of the p-type current spreading layer in integral region 102, forming an insulating dielectric layer 611 on p-type current spreading layer 801 and an insulating dielectric layer 612 on p-type current spreading layer 802. The first insulating dielectric layer preferably is made of silicon dioxide or silicon nitride, although other insulating materials can also be used, and its thickness is in the range of 100 nm to 1000 nm. Thereafter, an n-type current spreading layer 901, preferably a transparent conducting layer such as indium tin oxide (ITO), is deposited on insulating dielectric layer 611 in separating region 192, which can be achieved by depositing an n-type current spreading layer over the entire structure and, then, removing the unwanted portions of the n-type current spreading layer by etching to leave n-type current spreading layer 901 only in separating region 192, so that n-type current spreading layer 901 is not in contact with p-type layer 502. N-type current spreading layer 901 is in contact with n-type layer 302 via their sidewalls, and its thickness is preferably to be thicker than that of n-type layer 302, but thinner than the sum of n-type layer 302 and active-region 402. N-type current spreading layer 901 may or may not be in contact with active-region 402. Next, a passivation layer 613, such as silicon dioxide, is formed on top of n-type current spreading layer 901 by known method. And finally, anode contact 713 and cathode contact 711 are fabricated by a standard lithography and metallization process on p-type current spreading layer 802 and n-type current spreading layer 901, respectively.

As p-type current spreading layers 801 and 802 merge into a single p-type current spreading layer in region 102, holes injected from anode contact 713 will flow through p-type current spreading layer 802 and p-type layer 502 into active-region 402 and, in parallel, holes from anode contact 713 will also flow through p-type current spreading layer 801 and p-type layer 501 into active-region 401. Similarly, as n-type layers 301 and 302 merge into a single n-type layer in region 102, electrons injected from cathode contact 711 will flow through n-type current spreading layer 901 and n-type 302 into active-region 402 and, in parallel, electrons from cathode contact 711 will also flow through n-type current spreading layer 901 and n-type layer 302 to n-type layer 301, then into active-region 401. This means that LED structure 2 and 1 are electrically connected in parallel, via a true 3D interconnection approach.

To reduce electrical connection resistance between cathode contact and n-type layers in the LED structure, the number and density of LED structures 2 in one LED chip can be increased. The number of LED structures 2 in one LED chip, such as the elongated rod shaped LED structure 2 shown in FIGS. 5A-5D can be in the range from 1 to 50, preferably from 3-20, more preferably from 5-10. Further, an additional cathode contact 712 can be added, as shown in FIG. 8B.

The structure shown in FIG. 8B is the same as that shown in FIG. 8A except that an additional cathode contact 712 is provided on n-type layer 301. The structure shown in FIG. 8B can be fabricated as follows. After forming n-type current spreading layer 901, but before forming passivation layer 613 as discussed above in connection with FIG. 8A, a portion of n-type current spreading layer 901, insulating dielectric layer 611, p-type current spreading layer 801, p-type layer 501 and active-region 401 is removed to expose n-type layer 301 or to etch into n-type layer 301, forming a trench in n-type current spreading layer 901, insulating dielectric layer 611, p-type current spreading layer 801, p-type layer 501, and active-region 401. A conductive layer is then deposited to form a cathode contact 711 on n-type current spreading layer 901, an additional cathode contact 712 on n-type layer 301, and an anode contact 713 on p-type current spreading layer 802. The two cathode contacts 711 and 712 are connected via wire bonding to a cathode. All the patterning, etching, depositing, and epitaxial growing steps involved in the above process can use known method in the art.

The n-side series resistance of the LED embodiments shown in FIG. 8A-8C is expect to be larger than the p-side series resistance since n-current spreading layer 901 is in contact with n-layer 302 of LED structure 2 via sidewall contacting. To reduce the n-side series resistance, the number and density of LED structures 2 can be increased. Besides, the width of LED structure 2 can be smaller than the distance $W_1$ between neighboring LED structures 2. The width $W_2$ of LED structure 2 can be in the range of 10 to 200 microns, preferably 50-100 microns, more preferably 20-50 microns, the width $W_1$ of LED structure can be from 20 to 200 microns, preferably 20-50 microns. The ration $W_2/W_1$ can be in the range from 0.2 to 1.

A thin-film structure is realized in an embodiment shown in FIG. 8C. The thin-film structure shown in FIG. 8C is the same as the structure shown in FIG. 8A except that substrate 10 is removed or replaced by a conductive substrate 704. Conductive substrate 704 can be a transparent conductive material such as an ITO or ZnO wafer, or a conductive metal or silicon wafer coated with reflector on the top surface. In FIG. 8C an additional cathode contact 714 is formed on the bottom of a conductive substrate 704. The two cathode contacts 711 and 714 are connected via wire bonding to a cathode.

Figure 10:
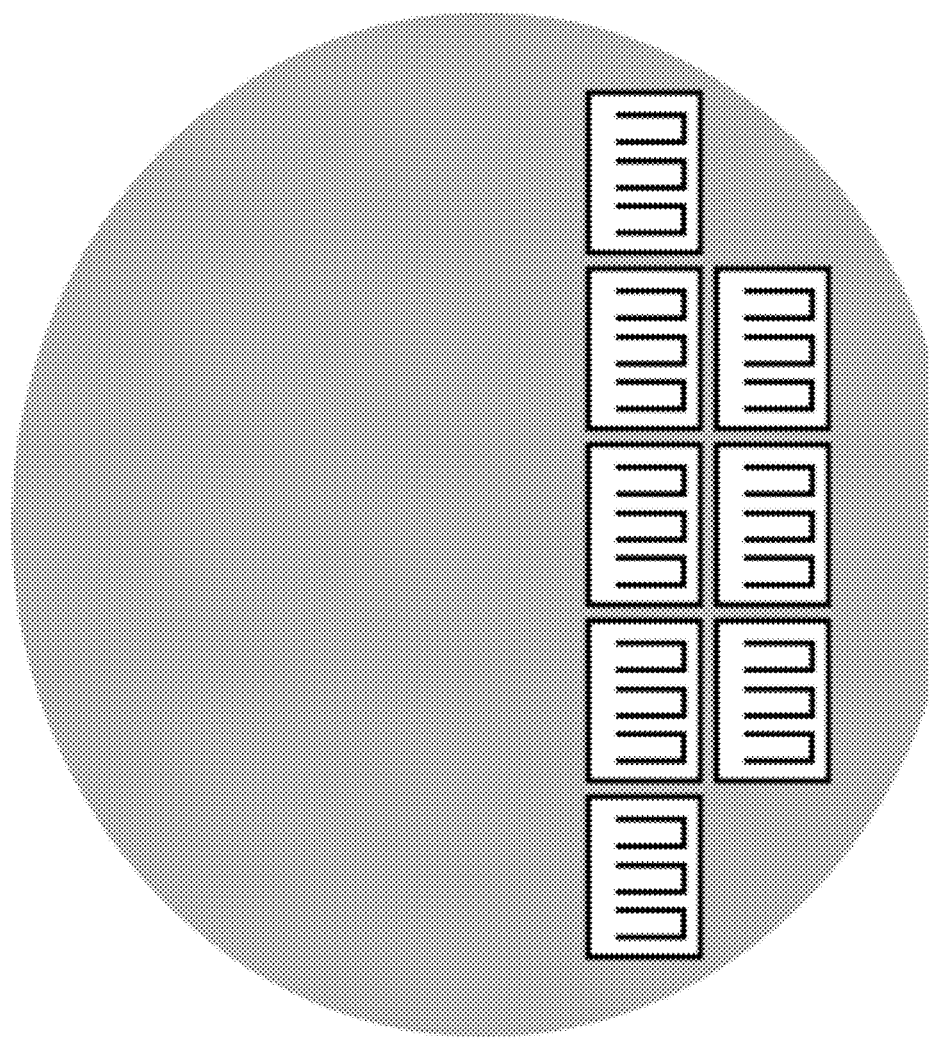
FIG. 10 illustrates the arrangement of LED chips on a wafer according to an embodiment of the present invention.

Presented in FIG. 10 is the schematic view of a wafer, showing the arrangement of many LED chips according to the present invention on a wafer. One wafer can contain 1500 to 20,000 LED chips depending on the chip size. Typically, the dimension of a single LED chip can be from several hundred microns to several millimeters.

The present invention has been described using exemplary embodiments. However, it is to be understood that the scope of the present invention is not limited to the disclosed embodiments. On the contrary, it is intended to cover various modifications and similar arrangement or equivalents. The scope of the claims, therefore, should be accorded the broadest interpretation so as to encompass all such modifications and similar arrangements and equivalents. For example, the above embodiments and drawings (for example, FIGS. 5A and 5B) show and describe that the lower LED structure 1 merges into an upper integral LED structure in integral region 102 via slope region 122, while LED structure 2 is at the same level with the integral LED structure. Clearly, the integral LED structure can be made at the same level with the lower LED structure 1, while LED structure 2 is higher than the integral LED structure.

What is claimed is:

1. A light emitting diode (LED) chip comprising:
    a substrate including an integral region, a separating region and a slope region therebetween;
    a mesa formed on the substrate, wherein the upper surface of the mesa is vertically displaced relative to the upper surface of the substrate exposed by the mesa in the separating region, and the upper surface of the substrate exposed by the mesa in the separating region is connected to the upper surface of the mesa in the integral region via a slope surface in the slope region;
    a first LED structure formed on the upper surface of the substrate exposed by the mesa in the separating region and a second LED structure formed on the upper surface of the mesa in the separating region, wherein the first LED structure comprises a first n-type layer, a first active-region, and a first p-type layer, the second LED structure comprises a second n-type layer, a second active-region, and a second p-type layer, and the first and second LED structures are separated from each other in the separating region, while in the integral region, the first and second n-type layers merge into a single n-type layer, the first and second active-regions merge into a single active-region, and the first and second p-type layers merge into a single p-type layer.

2. The light emitting diode (LED) chip of claim 1, wherein the mesa is an integral part of the substrate.

3. The light emitting diode (LED) chip of claim 1, further comprising a template layer between the substrate and the mesa, wherein the mesa is formed on the template layer, the upper surface of the mesa is vertically displaced relative to the upper surface of the template layer exposed by the mesa in the separating region, and the upper surface of the template layer exposed by the mesa in the separating region is connected to the upper surface of the mesa in the integral region via a slope surface in the slope region, and the first LED structure is formed on the upper surface of the template layer exposed by the mesa in the separating region.

4. The light emitting diode (LED) chip of claim 3, wherein the mesa is an integral part of the template layer.

5. The light emitting diode (LED) chip of claim 1, wherein the mesa is single insulating layer.

6. The light emitting diode (LED) chip of claim 1, wherein the mesa comprises an insulating top layer, a mid layer, and a bottom layer, and when the first n-type layer in the first LED structure is grown from the substrate, the mid layer is in contact with the first p-type layer and the first active-region via its sidewall, and the bottom layer is in contact with the first active-region and the first n-type layer via its sidewall, while when the first p-type layer in the first LED structure is grown from the substrate, the mid layer is in contact with the first n-type layer and the first active-region via its sidewall, and the bottom layer is in contact with the first active-region and the first p-type layer via its sidewall.

7. The light emitting diode (LED) chip of claim 6, wherein when the first n-type layer in the first LED structure is grown from the substrate, the mid layer is an insulating layer and the bottom layer is an n-type layer, or the mid layer is a p-type layer and the bottom layer is an insulating layer, while when the first p-type layer in the first LED structure is grown from the substrate, the mid layer is an insulating layer and the bottom layer is a p-type layer, or the mid layer is an n-type layer and the bottom layer is an insulating layer.

8. The light emitting diode (LED) chip of claim 1, further comprising a gap in the slope region, which separates the first and second LED structures in the slope region.

9. A light emitting diode (LED) chip comprising:
a base for epitaxial growth thereon, having an integral region, a separating region and a slope region located between, wherein there are at least a group of first surfaces and a group of second surfaces vertically displaced from the first surfaces in the separating region, and the first surfaces and the second surfaces merge into a single surface in the integral region via a slope surface in the slope region;
a first LED structure formed on the first surfaces in the separating region and a second LED structure formed on the second surfaces in the separating region, wherein the first LED structure comprises a first n-type layer, a first active-region, and a first p-type layer, the second LED structure comprises a second n-type layer, a second active-region, and a second p-type layer, and the first and second LED structures are separated from each other in the separating region, while in the integral region, the first and second n-type layers merge into a single n-type layer, the first and second active-regions merge into a single active-region, and the first and second p-type layers merge into a single p-type layer, via the slope surface in the slope region.

10. The light emitting diode (LED) chip of claim 9, wherein the first surfaces and the second surfaces are connected by vertical sidewalls.

11. The light emitting diode (LED) chip of claim 9, wherein the base is a single substrate.

12. The light emitting diode (LED) chip of claim 9, wherein the base includes a substrate with vertically displaced upper surfaces and a template layer conformably formed on the substrate.

13. The light emitting diode (LED) chip of claim 9, wherein the base includes a flat substrate and a template layer with vertically displaced upper surfaces.

14. The light emitting diode (LED) chip of claim 9, wherein the base includes a flat substrate and a mesa of predetermined pattern formed on the substrate.

15. The light emitting diode (LED) chip of claim 9, wherein the base includes a flat substrate, a flat template layer formed on the substrate and a mesa of predetermined pattern formed on the flat template layer, wherein the upper surfaces of the mesa in the separating region constitute the second surfaces and the upper surfaces of the template layer exposed by the mesa in the separating region constitute the first surfaces.

16. The light emitting diode (LED) chip of claim 15, wherein the mesa comprises an insulating top layer, a mid layer, and a bottom layer, and when the first n-type layer in the first LED structure is grown from the base, the mid layer is in contact with the first p-type layer and the first active-region via its sidewall, and the bottom layer is in contact with the first active-region and the first n-type layer via its sidewall, while when the first p-type layer in the first LED structure is grown from the base, the mid layer is in contact with the first n-type layer and the first active-region via its sidewall, and the bottom layer is in contact with the first active-region and the first p-type layer via its sidewall.

17. The light emitting diode (LED) chip of claim 16, wherein when the first n-type layer in the first LED structure is grown from the base, the mid layer is an insulating layer and the bottom layer is an n-type layer, or the mid layer is a p-type layer and the bottom layer is an insulating layer, while when the first p-type layer in the first LED structure is grown from the base, the mid layer is an insulating layer and the bottom layer is a p-type layer, or the mid layer is an n-type layer and the bottom layer is an insulating layer.

18. The light emitting diode (LED) chip of claim 9, further comprising a gap in the slope region, which separates the first and second LED structures in the slope region.

19. A light emitting diode (LED) chip comprising:
a substrate;
a mesa formed on the substrate, wherein the upper surface of the mesa is vertically displaced relative to the upper surface of the substrate exposed by the mesa;
a first LED structure formed on the upper surface of the substrate exposed by the mesa and a second LED structure formed on the upper surface of the mesa, wherein the first LED structure comprises a first n-type layer, a first active-region, and a first p-type layer, the second LED structure comprises a second n-type layer, a second active-region, and a second p-type layer; and
if the first and second n-type layers are grown from the substrate and the mesa, the first p-type layer is in contact with the second n-type layer via its sidewall, and if the first and second p-type layers are grown from the substrate and the mesa, the first n-type layer is in contact with the second p-type layer via its sidewall,
wherein the mesa comprises a top layer and a bottom layer, and when the first and second n-type layers are grown from the substrate and mesa, the top layer is in contact with the first p-type layer and the first active-region via its sidewall, and the bottom layer is in contact with the first active-region and the first n-type layer via its sidewall, and the top layer is an insulating layer and the bottom layer is an n-type layer, or the top layer is a p-type layer and the bottom layer is an insulating layer, while when the first and second p-type layers are grown from the substrate and the mesa, the top layer is in contact with the first n-type layer and the first active-region via its sidewall, and the bottom layer is in contact with the first active-region and the first p-type layer via its sidewall, the top layer is an insulating layer and the bottom layer is a p-type layer, or the mid layer is an n-type layer and the bottom layer is an insulating layer.

20. The light emitting diode (LED) chip of claim 19, wherein the mesa is an integral part of the substrate.

21. The light emitting diode (LED) chip of claim 19, further comprising a template layer between the substrate and the mesa, wherein the mesa is formed on the template layer, the upper surface of the mesa is vertically displaced relative to the upper surface of the template layer exposed by the mesa, and the first LED structure is formed on the upper surface of the template layer exposed by the mesa.

22. The light emitting diode (LED) chip of claim 21, wherein the mesa is an integral part of the template layer.

23. A light emitting diode (LED) chip comprising:
a substrate;
a mesa formed on the substrate, wherein the upper surface of the mesa is vertically displaced relative to the upper surface of the substrate exposed by the mesa;
a first LED structure formed on the upper surface of the substrate exposed by the mesa and a second LED structure formed on the upper surface of the mesa, wherein the first and second LED structures are completely separated by the mesa,
wherein the mesa comprises a top insulating layer and a bottom layer, and when the first and second n-type layers are grown from the substrate and mesa, the top layer is in contact with the first p-type layer and the first active-region via its sidewall, and the bottom layer is in contact with the first active-region and the first n-type layer via its sidewall, and the bottom layer is an n-type layer or an insulating layer, while when the first and second p-type layers are grown from the substrate and the mesa, the top layer is in contact with the first n-type layer and the first active-region via its sidewall, and the bottom layer is in contact with the first active-region and the first p-type layer via its sidewall, the bottom layer is a p-type layer or an insulating layer.

24. The light emitting diode (LED) chip of claim 23, wherein the mesa is an integral part of the substrate.

25. The light emitting diode (LED) chip of claim 23, further comprising a template layer between the substrate and the mesa, wherein the mesa is formed on the template layer, the upper surface of the mesa is vertically displaced relative to the upper surface of the template layer exposed by the mesa, and the first LED structure is formed on the upper surface of the template layer exposed by the mesa.

26. The light emitting diode (LED) chip of claim 25, wherein the mesa is an integral part of the template layer.

* * * * *